US011810956B2

(12) United States Patent
Huang et al.

(10) Patent No.: US 11,810,956 B2
(45) Date of Patent: Nov. 7, 2023

(54) IN-SITU THERMAL ANNEALING OF ELECTRODE TO FORM SEED LAYER FOR IMPROVING FERAM PERFORMANCE

(71) Applicant: Taiwan Semiconductor Manufacturing Company, Ltd., Hsinchu (TW)

(72) Inventors: Yen-Chieh Huang, Changhua County (TW); Po-Ting Lin, Taichung (TW); Song-Fu Liao, Taipei (TW); Hai-Ching Chen, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 71 days.

(21) Appl. No.: 17/570,028

(22) Filed: Jan. 6, 2022

(65) Prior Publication Data

US 2023/0143625 A1 May 11, 2023

Related U.S. Application Data

(60) Provisional application No. 63/278,241, filed on Nov. 11, 2021.

(51) Int. Cl.
*H01L 29/66* (2006.01)
*H01L 29/78* (2006.01)
(Continued)

(52) U.S. Cl.
CPC .... *H01L 29/40111* (2019.08); *H01L 29/6684* (2013.01); *H01L 29/78391* (2014.09); *H10B 51/00* (2023.02)

(58) Field of Classification Search
CPC .......... H01L 29/40111; H01L 29/6684; H01L 29/78391; H01L 29/516; H10B 51/00
(Continued)

(56) References Cited

U.S. PATENT DOCUMENTS 10,276,697 B1 * 4/2019 Lu ..................... H01L 29/66795
2011/0062859 A1 * 3/2011 Kawamura ............ H10K 59/38
313/504
(Continued)

OTHER PUBLICATIONS

Gaddam et al. "Ferroelectricity Enhancement in Hf0.5Zr0.5O2 Capacitors by Incorporating Ta2O5 Dielectric Seed Layers" 2020 IEEE Electron Devices Technology and Manufacturing Conference Proceedings of Technical Papers, published on Jun. 16, 2020.
(Continued)

*Primary Examiner* — Sheikh Maruf
(74) *Attorney, Agent, or Firm* — Eschweiler & Potashnik, LLC

(57) ABSTRACT

In some embodiments, the present disclosure relates to a method for forming an integrated circuit (IC), including forming a first electrode layer having a first metal over a substrate, performing a first atomic layer deposition (ALD) pulse that exposes the first electrode layer to oxygen atoms, exposing the first electrode layer to a first temperature, the first temperature causing the first electrode layer to react with the oxygen atoms to form a seed structure over the first electrode layer, and performing a series of ALD pulses at a second temperature to form a ferroelectric structure over the seed structure. The second temperature is less than the first temperature and the ferroelectric structure is configured to store a data state.

20 Claims, 29 Drawing Sheets

(51) Int. Cl.
H01L 21/28 (2006.01)
H10B 51/00 (2023.01)

(58) Field of Classification Search
USPC .............................................................. 257/3
See application file for complete search history.

(56) References Cited

U.S. PATENT DOCUMENTS

| | | | | |
|---|---|---|---|---|
| 2012/0038267 | A1* | 2/2012 | Hanamura | H10K 59/38 |
| | | | | 313/504 |
| 2014/0307430 | A1* | 10/2014 | Lo | G09F 9/30 |
| | | | | 362/231 |
| 2015/0054719 | A1* | 2/2015 | Lee | G09G 3/3208 |
| | | | | 345/76 |
| 2016/0351673 | A1* | 12/2016 | Lai | H01L 21/823431 |
| 2019/0131382 | A1* | 5/2019 | Lu | H01L 29/78391 |
| 2020/0066604 | A1* | 2/2020 | Mochizuki | H01L 29/7827 |
| 2020/0119113 | A1* | 4/2020 | Lee | H10K 50/8445 |
| 2020/0328287 | A1* | 10/2020 | Chen | H01L 29/516 |
| 2021/0035989 | A1* | 2/2021 | Lee | H10B 51/00 |
| 2021/0193811 | A1* | 6/2021 | Moon | H01L 21/02181 |
| 2021/0280721 | A1* | 9/2021 | Gros-Jean | H10B 51/40 |

OTHER PUBLICATIONS

Onaya et al. "Improvement in ferroelectricity of HfxZr1%xO2 thin films using ZrO2 seed layer" Applied Physics Express 10, 081501 (2017), published on Jul. 13, 2017.

Onaya et al. "Improvement in ferroelectricity of HfxZr1-xO2 thin films using top- and bottom-ZrO2 nucleation layers" APL Mater. 7, 061107 (2019), published on Jun. 27, 2019.

Liu et al. "Structure and Dielectric Property of High-k ZrO2 Films Grown by Atomic Layer Deposition Using Tetrakis (Dimethylamido) Zirconium and Ozone" Nanoscale Research Letters (2019) 14:154, published on May 7, 2019.

* cited by examiner

IN-SITU THERMAL ANNEALING OF ELECTRODE TO FORM SEED LAYER FOR IMPROVING FERAM PERFORMANCE

REFERENCE TO RELATED APPLICATION

This application claims the benefit of U.S. Provisional Application No. 63/278,241, filed on Nov. 11, 2021, the contents of which are hereby incorporated by reference in their entirety.

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
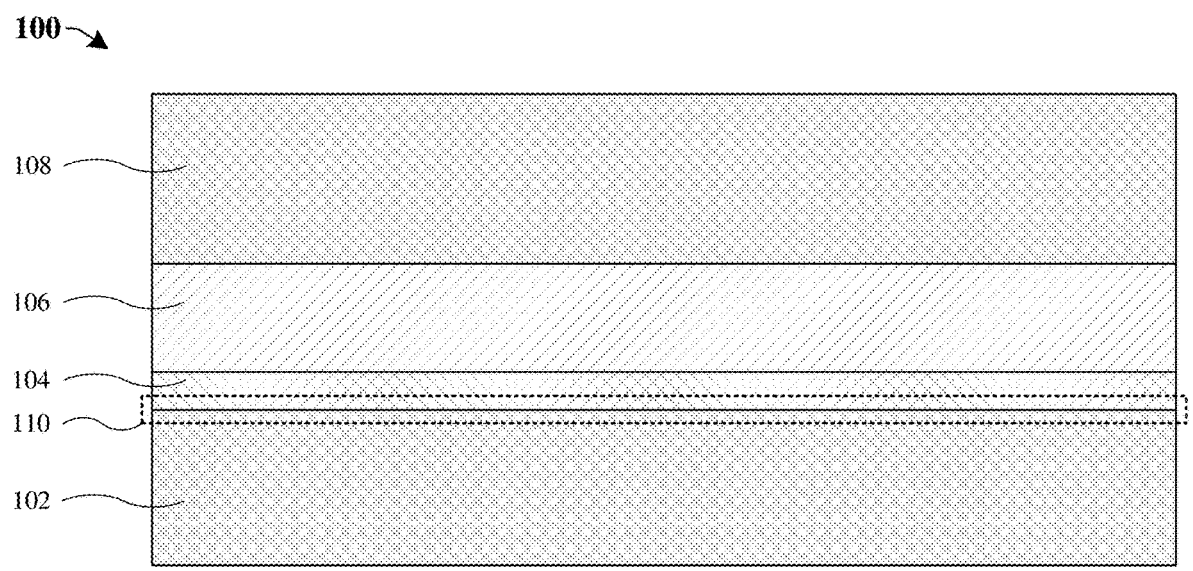
FIG. 1 illustrates a cross-sectional view some embodiments of an integrated circuit (IC) in which a metal-ferroelectric-metal (MFM) structure comprises a seed layer with a non-uniform oxygen distribution and a ferroelectric layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric materials are commonly used in memory structures, such as metal-ferroelectric-metal (MFM) structures, metal-ferroelectric-insulator-semiconductor (MFIS) structures, ferroelectric field-effect transistors (FeFETs), and thin film transistors (TFTs). Further, ferroelectric materials have a remanent polarization switchable between a first state and a second state by application of an electric field. Certain ferroelectric materials exhibit polycrystallinity that may determine remanent polarization behavior. Amongst these ferroelectric materials, three main crystalline phases are present: tetragonal, monoclinic, and orthorhombic. Further, amongst these three main crystalline phases, the orthorhombic phase exhibits the strongest remanent polarization. Hence, increasing the ratio of the orthorhombic phase to other phases may increase remanent polarization in the first and second states.

The larger the polarization difference (e.g., 2Pr) between the first and second states, the more resilient read operations are in ferroelectric memory. The polarization difference can be increased by increasing the ratio of the orthorhombic phase to other phases. However, increasing the ratio of the orthorhombic phase to other phases can be challenging when a ferroelectric layer is formed directly on an electrode.

In view of the above, in the present disclosure, a ferroelectric memory structure comprising a seed layer disposed between an electrode and a ferroelectric layer is proposed. Depositing the seed layer through the use of a precursor can be slow, can be costly, and can leave the precursor remaining in unwanted areas of the device. Thus, the present disclosure proposes some embodiments of a method for forming the seed layer without the use of a precursor. In some embodiments, an electrode is formed over a substrate and the electrode is exposed to oxygen atoms. Rather than undergoing a timely process where an expensive precursor is used to form the seed layer and where the precursor may be left remaining where it isn't wanted, the electrode undergoes a heating process, which causes the oxygen atoms to react with the electrode directly to form the seed layer over the electrode. A ferroelectric layer is then formed over the seed layer.

The seed layer promotes growth of orthorhombic phase crystals in the ferroelectric layer and/or inhibits growth of monoclinic phase crystals in the ferroelectric layer, which increases the polarization difference of the ferroelectric layer. Thus, the performance of the memory structure may be improved without undergoing the slow and costly process of providing a precursor to form the seed layer. This process results in the seed layer having a higher uniformity of crystalline phase (e.g., a higher uniformity of tetragonal crystalline phase, a higher uniformity of orthorhombic crystalline phase, etc.) than other deposition processes that use a precursor. This process may cause the seed layer to have a predominant crystalline phase. The higher uniformity of crystalline phase promotes a higher percentage of orthorhombic crystalline phase within the ferroelectric layer, improving a performance of the ferroelectric layer. This process further avoids leaving remaining precursor in unwanted areas of the device.

Additionally, this process results in the seed layer having a non-uniform oxygen concentration, such that oxygen is more concentrated near the electrode. Hence, oxygen ions may enter an inter-diffusion region between the seed layer and the electrode and recombine with defects (e.g., oxygen vacancies) to reduce the number of defects in the inter-diffusion region. In doing so, the presence of the inter-diffusion region may prevent charges from being formed at the interface of the seed layer and the first electrode. Interface charges can reduce a voltage drop and/or a remanent polarization of the MFM structure, thereby negatively impacting its performance, so by preventing their formation, device performance may be positively impacted.

FIG. 1 illustrates a cross-sectional view 100 of some embodiments of an IC in which a MFM structure comprises a seed layer 104 having a non-uniform oxygen distribution and a ferroelectric layer 106. The first electrode 102 is vertically stacked with the ferroelectric layer 106 and a second electrode 108. The ferroelectric layer 106 separates the first electrode 102 from the second electrode 108. The seed layer 104 is vertically stacked with the first electrode 102, the ferroelectric layer 106, and the second electrode 108, and the seed layer 104 separates the ferroelectric layer 106 from the first electrode 102.

By appropriately biasing the ferroelectric layer 106, the remanent polarization may be changed between a first state and a second state. For example, in some embodiments, applying a first voltage having a positive polarity from the second electrode 108 across the ferroelectric layer 106 to the first electrode 102 may set the first state. Further, applying a second voltage having a negative polarity from the second electrode 108 across the ferroelectric layer 106 to the first electrode 102 may set the second state. Because the remanent polarization may be electrically measured, the remanent polarization may be employed to represent a bit of data, and thus the ferroelectric layer is configured to store a data state. For example, the first state may represent a binary "1", whereas the second state may represent a binary "0", or vice versa.

In some embodiments, the ferroelectric layer 106 is polycrystalline and has a plurality of crystalline phases (e.g., crystalline grain types). The plurality of crystalline phases may comprise the tetragonal phase, the monoclinic phase, and/or the orthorhombic phase. In some embodiments, the plurality of crystalline phases further comprises the cubic phase and/or some other suitable crystalline phase(s). Further, the seed layer 104 promotes the formation of orthorhombic phase crystals in the ferroelectric layer 106 and/or inhibits the monoclinic phase in the ferroelectric layer 106 such that the orthorhombic phase dominates in the ferroelectric layer 106 (e.g., the orthorhombic phase is a predominant crystalline phase of the ferroelectric layer 106). In other words, the presence of the seed layer 104 makes the orthorhombic phase a majority phase in the ferroelectric layer 106.

An inter-diffusion region 110 is disposed between the seed layer 104 and the first electrode 102. In some embodiments, the seed layer 104 comprises oxygen ions. In further embodiments, the seed layer 104 may have a non-uniform oxygen distribution. In further embodiments, the non-uniform oxygen distribution of the seed layer 104 is such that oxygen is more concentrated near the first electrode 102. In some embodiments, since oxygen ions are more concentrated near the first electrode 102, oxygen ions may enter the inter-diffusion region 110 from the seed layer 104 and recombine with defects (e.g., oxygen vacancies) to reduce the number of defects in the inter-diffusion region 110. In doing so, in some embodiments, the inter-diffusion region 110 may prevent charges from being formed at an interface of the seed layer 104 and the first electrode 102, positively impacting device performance.

In some embodiments, the seed layer 104 may be formed by way of a thermal process that is performed in-situ with formation of the ferroelectric layer 106. The in-situ thermal process results in the seed layer 104 having a higher uniformity of crystalline phase (e.g., a higher uniformity of tetragonal crystalline phase, a higher uniformity of orthorhombic crystalline phase, etc.) than other deposition processes that use a precursor. For example, forming a seed layer by way of an ALD process may result in a higher percentage of the seed layer 104 being amorphous than the thermal process. In some embodiments, the in-situ thermal process may cause the seed layer 104 to have a predominant crystalline phase. The higher uniformity of crystalline phase promotes a higher percentage of orthorhombic crystalline phase within the ferroelectric layer 106. Because orthorhombic phase exhibits a stronger remanent polarization than other crystalline phases, the in-situ ALD process improves a performance of the ferroelectric layer due to a larger difference (e.g., 2Pr) in remanent polarization between the first state and the second state, which results in a larger memory read window and hence more resilient memory read operations.

Figure 2:
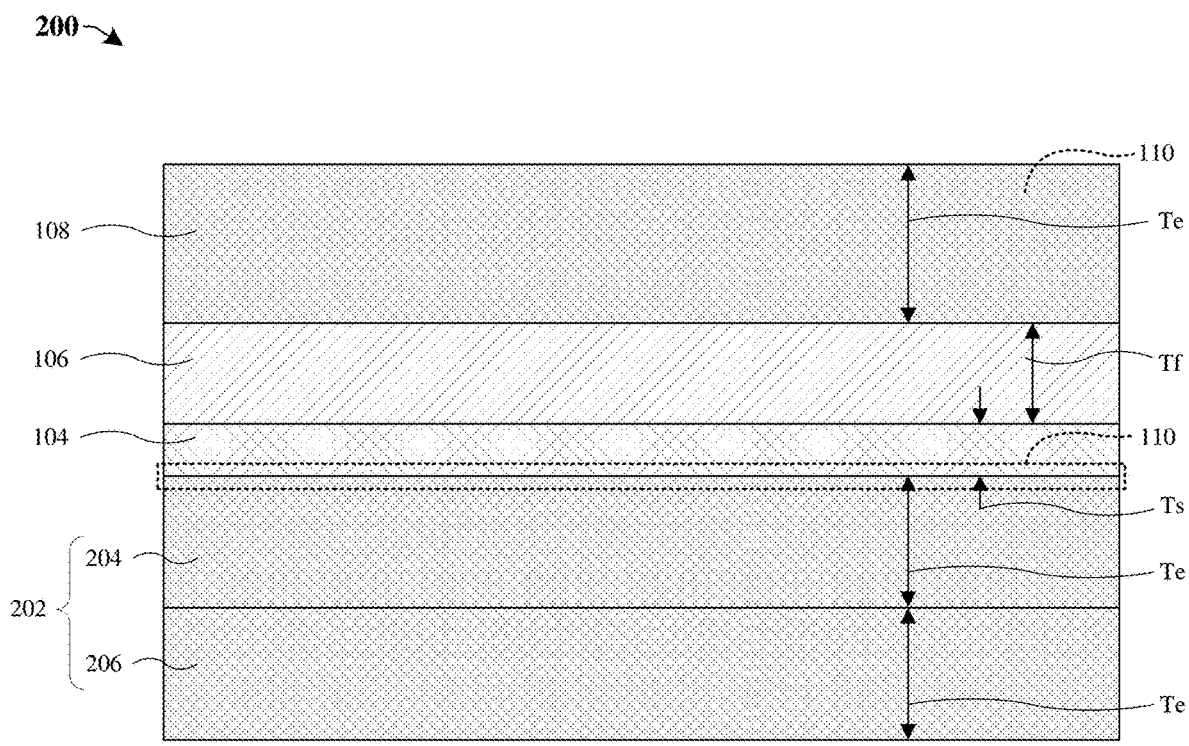
FIG. 2 illustrates a cross-sectional view of some alternative embodiments of the IC of FIG. 1.

FIG. 2 illustrates a cross-sectional view 200 of some alternative embodiments of the IC of FIG. 1. A first electrode 202 is a bi-layer electrode comprising a first material 204 and a second material 206 stacked below the first material 204. In some embodiments, the second electrode 108 and the first material 204 of the first electrode 202 have individual thicknesses Te ranging from approximately 10 nanometers to approximately 100 nanometers, approximately 10 nanometers to approximately 50 nanometers, approximately 50 nanometers to approximately 100 nanometers, or some other suitable value. In some embodiments, the first material 204 may be as described with respect to the first electrode 102 of FIG. 1. In some embodiments, the second electrode 108 has a substantially same thickness Te as the first material 204. In some embodiments, the second material 206 of the first electrode 202 may have the thickness Te. In alternative embodiments, the first electrode 202 may have the thickness Te.

In some embodiments, the seed layer 104 has a thickness Ts ranging from approximately 0.5 nanometers to approximately 5 nanometers, approximately 0.5 nanometers to approximately 2 nanometers, approximately 2 nanometers to approximately 5 nanometers, or some other suitable value. In some embodiments, if the thickness Ts is too large (e.g., greater than approximately 5 nanometers), increased resistance of the seed layer 104 may degrade power efficiency and shift operating parameters out of specification. If the thickness Ts is too small (e.g., less than approximately 0.5 nanometers), the seed layer 104 may fail to sufficiently promote orthorhombic phase crystal growth in the ferroelectric layer 106. In some embodiments, the thickness Te of the first electrode 102 may be more than approximately 20 times greater the thickness Ts of the seed layer 104.

In some embodiments, the ferroelectric layer 106 has a thickness Tf ranging from approximately 1 nanometer to approximately 100 nanometers, approximately 1 nanometer to approximately 20 nanometers, approximately 20 nanometers to approximately 30 nanometers, approximately 50 nanometers to approximately 100 nanometers, or some other suitable value. In some embodiments, if the thickness Tf is too large (e.g., greater than approximately 100 nanometers), the ferroelectric layer 106 may become thermodynamically unstable in the orthorhombic crystalline phase, thereby decreasing remanent polarization. If the thickness Tf is too small (e.g., less than approximately 1 nanometer), the ferroelectric layer 106 may provide an insufficient amount of remanent polarization to store data reliably.

In some embodiments, the seed layer 104 may be or comprise, for example, tantalum pentoxide (e.g., $Ta_2O_5$), zirconium dioxide (e.g., $ZrO_2$), titanium dioxide (e.g., $TiO_2$), tungsten trioxide (e.g., $WO_3$), titanium oxynitride (e.g., $TiO_xN_y$), tantalum oxynitride (e.g., $TaO_xN_y$), or some other suitable metal oxide(s) or metal oxynitride(s). In embodiments in which the seed layer 104 is or comprises titanium dioxide or zirconium dioxide, the seed layer 104 has a tetragonal crystalline phase. In embodiments in which the seed layer 104 is or comprises tantalum pentoxide or tungsten trioxide, the seed layer 104 is orthorhombic crystalline phase.

In some embodiments, the ferroelectric layer 106 is or comprises hafnium zirconium oxide (e.g., HfZrO) and/or are doped with aluminum (e.g., Al), silicon (e.g., Si), lanthanum (e.g., La), scandium (e.g., Sc), calcium (e.g., Ca), barium (e.g., Ba), gadolinium (e.g., Gd), yttrium (e.g., Y), strontium (e.g., Sr), some other suitable element(s), or any combination of the foregoing to increase remanent polarization. In some embodiments, the ferroelectric layer 106 is or comprises $Hf_xZr_{1-x}O_2$ with x ranging from 0 to 1. For example, the ferroelectric layer 106 may be or comprise $Hf_{0.5}Zr_{0.5}O_2$. In some embodiments, the ferroelectric layer 106 is or comprises aluminum nitride (e.g., AlN) doped with scandium (e.g., Sc) and/or some other suitable element(s). In some embodiments, the ferroelectric layer 106 is or comprises a material with oxygen vacancies. In some embodiments, the ferroelectric layer 106 is some other suitable ferroelectric material(s).

In some embodiments, the first material 204 and the second electrode 108 are or comprise titanium nitride (e.g., TiN), tantalum nitride (e.g., TaN), titanium (e.g., Ti), tantalum (e.g., Ta) tungsten (e.g., W), zirconium (e.g., Zr), some other suitable metal(s), or any alloy or combination of the foregoing. In some embodiments, the first electrode 102 may be or comprise a different material than the second electrode 108. In some embodiments, the first electrode 102 may be or comprise a same material as the second electrode 108.

In some embodiments, the second material 206 is or comprises titanium nitride (e.g., TiN), tantalum nitride (e.g., TaN), titanium (e.g., Ti), tantalum (e.g., Ta) tungsten (e.g., W), zirconium (e.g., Zr), some other suitable metal(s), or any alloy or combination of the foregoing.

Figure 3:
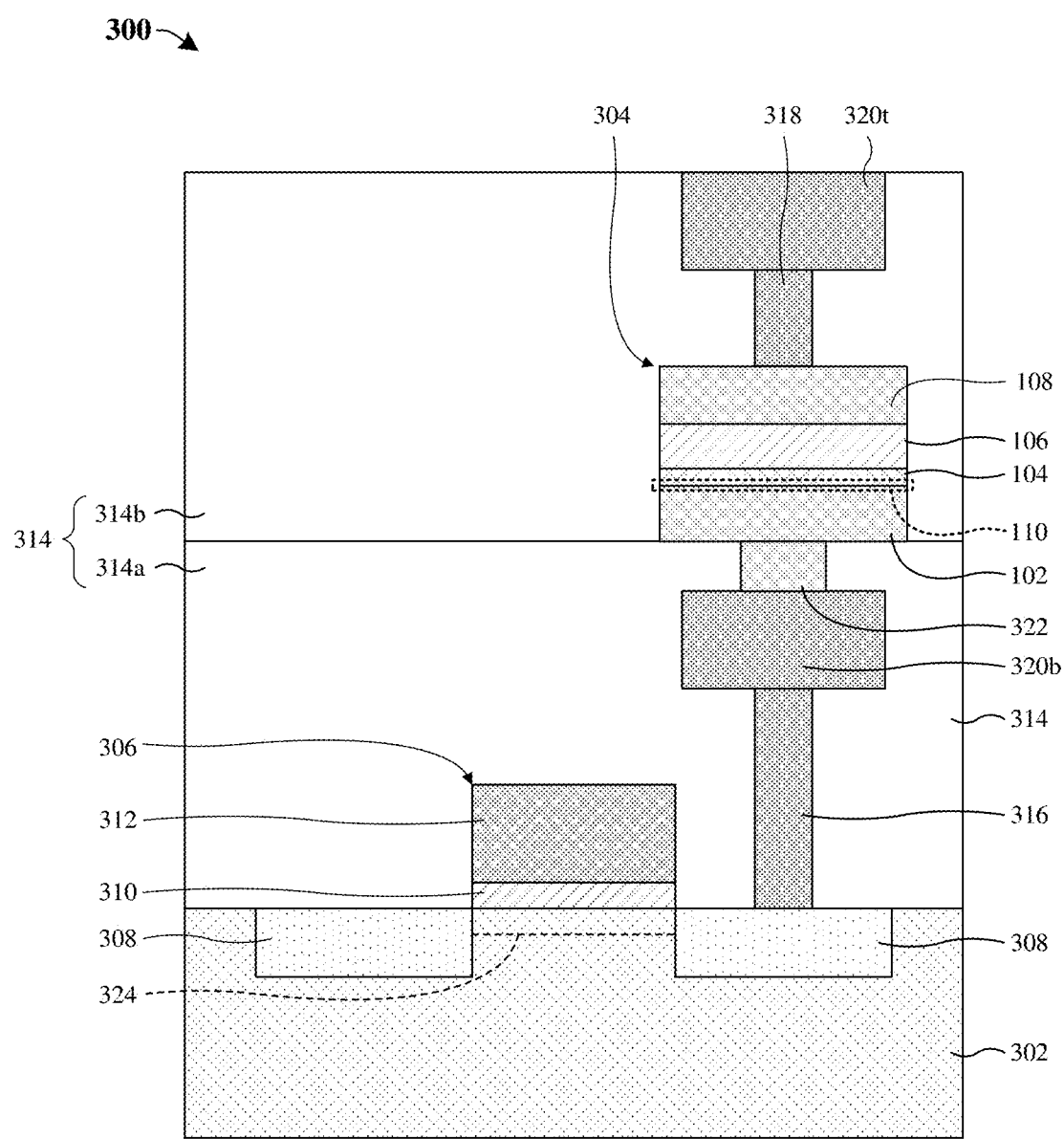
FIG. 3 illustrates a cross-sectional view of some embodiments of an IC in which a one-transistor one-capacitor (1T1C) memory structure comprises the MFM structure of FIG. 1.

FIG. 3 illustrates a cross-sectional view 300 of some embodiments of an IC in which a one-transistor one-capacitor (1T1C) memory structure comprises the MFM structure of FIG. 1. A ferroelectric memory structure 304 overlies and is electrically coupled to an access device 306. In some embodiments, the ferroelectric memory structure 304 may be the MFM structure of FIG. 1. The access device 306 is on and partially within a substrate 302. Further, the access device 306 comprises a pair of source/drain regions 308, a gate dielectric layer 310, and a gate electrode 312. The pair of source/drain regions 308 are embedded in a top of the substrate 302, and the gate dielectric layer 310 and the gate electrode 312 are stacked laterally between the source/drain regions 308. In some embodiments, the access device 306 is a planar field-effect transistor (FET), a fin FET (FinFET), a gate-all-around (GAA) FET, or some other suitable type of semiconductor device.

An interconnect structure overlies the substrate 302 and electrically couples to the ferroelectric memory structure 304 and the access device 306. The interconnect structure comprises a contact via 316, an interlevel via 318, a bottom wire 320b, and a top wire 320t in an interconnect dielectric structure 314. The contact via 316 extends from a bottom wire 320b to one of the source/drain regions 308. Further, a bottom electrode via (BEVA) 322 is at a bottom of the ferroelectric memory structure 304 and extends from the first electrode 102 to the bottom wire 320b. The interlevel via 318 overlies the ferroelectric memory structure 304 and extends from the top wire 320t to the ferroelectric memory structure 304. In some embodiments, the interlevel via 318 electrically couples the second electrode 108 to the top wire 320t. In some embodiments, the interconnect dielectric structure 314 comprises a lower interconnect dielectric layer 314a and an upper interconnect dielectric layer 314b.

During operation, a bit of data is stored in the ferroelectric memory structure 304 using the remanent polarization of the ferroelectric layer 106 to represent the bit. To write, the gate electrode 312 is biased so a channel region 324 underlying the gate electrode 312 conducts and electrically connects the source/drain regions 308. A set voltage or a reset voltage is then applied across the ferroelectric memory structure 304 through the channel region 324 of the access device 306 to set the remanent polarization respectively to a first state or a second state. To read, the gate electrode 312 is again biased so the channel region 324 electrically connects the source/drain regions 308. The set or reset voltage is then applied across the ferroelectric memory structure 304 through the channel region 324 of the access device 306. If the state of the remanent polarization changes, re-orientation of atoms in the ferroelectric layer 106 pushes electrons out of the ferroelectric memory structure 304, causing a current pulse to occur across the ferroelectric memory structure 304. If the state of the remanent polarization doesn't change, then no current pulse occurs. Thus, the current pulse is used to read the state of the remanent polarization.

In some embodiments, the substrate 302 is a bulk substrate of silicon, a silicon-on-insulator (SOI) substrate, or some other suitable semiconductor substrate. In some embodiments, the source/drain regions 308 are doped regions of the substrate 302. In other embodiments, the source/drain regions 308 are independent of the substrate 302 and overlie a top surface of the substrate 302. In some embodiments, the gate electrode 312 is or comprises doped polysilicon, metal, some other suitable conductive material, or any combination of the foregoing. In some embodiments, the gate dielectric layer 310 is or comprises silicon dioxide and/or some other suitable dielectric material(s). In some embodiments, the top wire 320t, the bottom wire 320b, the interlevel via 318, the contact via 316, and the BEVA 322 are or comprise metal and/or some other suitable conductive material. In some embodiments, the interconnect dielectric structure 314 is or comprises an oxide and/or some other suitable dielectric material(s).

While the ferroelectric memory structure 304 is illustrated as described with respect to FIG. 1, the ferroelectric memory structure 304 may be as described with respect to the MFM structure of FIG. 2. While the ferroelectric memory structure 304 is described as part of a 1T1C memory structure, the ferroelectric memory structure 304 may alternatively be part of a two-transistor two-capacitor (2T2C) memory structure in alternative embodiments.

Figure 4:
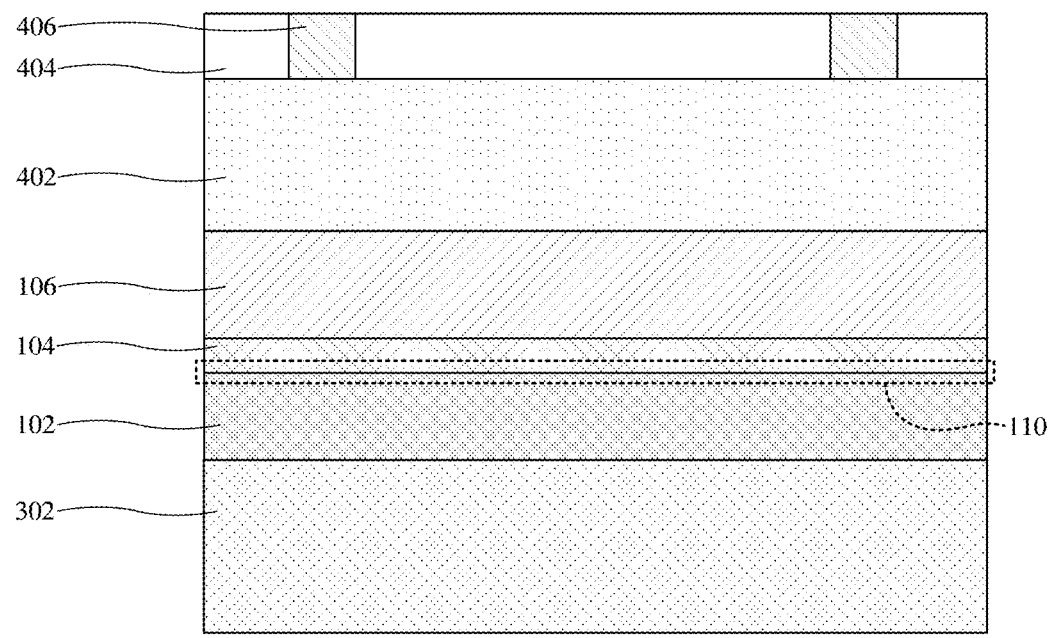
FIG. 4 illustrates a cross-sectional view of some embodiments of an IC in which a bottom gate ferroelectric field-effect transistor (FeFET) structure comprises a seed layer.

FIG. 4 illustrates a cross-sectional view 400 of some embodiments of an IC in which a bottom gate ferroelectric field-effect transistor (FeFET) structure comprises a seed layer 104. A first electrode 102 overlies a substrate 302. A ferroelectric layer 106 is disposed over the first electrode 102. A seed layer 104 is vertically stacked with the first electrode 102 and the ferroelectric layer 106, and the seed layer 104 separates the ferroelectric layer 106 from the first electrode 102. A semiconductor layer 402 is disposed over the ferroelectric layer 106, and a dielectric structure 404 is disposed over the semiconductor layer 402. A pair of source/drain contacts 406 is disposed within the dielectric structure 404 and respectively on opposing ends of the semiconductor layer 402. The pair of source/drain contacts 406 is disposed on an opposite side of the semiconductor layer 402 than the first electrode 102.

The seed layer 104 promotes the formation of orthorhombic phase crystals in the ferroelectric layer 106 and/or inhibits the monoclinic phase in the ferroelectric layer 106 such that the orthorhombic phase dominates in the ferroelectric layer 106. Since the orthorhombic phase dominates, the ferroelectric layer 106 has a strong remanent polarization.

An inter-diffusion region 110 is disposed between the seed layer 104 and the first electrode 102. In some embodiments, the seed layer 104 comprises oxygen ions. In further embodiments, the seed layer 104 may have a non-uniform oxygen distribution. In further embodiments, the non-uniform oxygen distribution of the seed layer 104 is such that oxygen is more concentrated near the first electrode 102. In some embodiments, oxygen ions may enter the inter-diffusion region 110 from the seed layer 104 and recombine with defects (e.g., oxygen vacancies). In doing so, in some embodiments, the inter-diffusion region 110 may prevent charges from being formed at an interface of the seed layer 104 and the first electrode 102, positively impacting device performance.

During operation of the bottom gate FeFET structure, the remanent polarization of the ferroelectric layer 106 is employed to represent a bit of data. A first state of the remanent polarization may represent a binary 1, whereas a second state of the remanent polarization may represent a binary 0, or vice versa.

To write to the bottom gate FeFET structure, a set voltage or a reset voltage is applied from the first electrode 102 to the semiconductor layer 402 (e.g., via the source/drain contacts 406). The set and reset voltages have opposite polarities and magnitudes in excess of a coercive voltage of the ferroelectric layer 106. The set voltage sets the remanent polarization of the ferroelectric layer 106 to the first state, whereas the reset voltage sets the remanent polarization to the second state, or vice versa.

To read from the bottom gate FeFET structure, a read voltage less than the coercive voltage of the ferroelectric layer 106 is applied from the first electrode 102 to a source one of the pair of source/drain contacts 406. Depending on whether the semiconductor layer 402 conducts, the remanent polarization is in the first or second state.

More particularly, because the bottom gate FeFET structure is a FET, the semiconductor layer 402 selectively conducts depending upon whether a voltage applied to the first electrode 102 exceeds a threshold voltage. Further, the ferroelectric layer 106 changes the threshold voltage based on a state of the remanent polarization. Therefore, the semiconductor layer 402 conducts based on the state of the remanent polarization when the read voltage is between the different threshold voltage states.

In some embodiments, the semiconductor layer 402 may be or comprise, for example, amorphous Indium-Gallium-Zinc-Oxide (a-IGZO), silicon, silicon germanium, a group III-V material, a group II-VI material, some other suitable semiconductor material, or any combination of the foregoing. The group III-V material may, for example, be or comprise gallium arsenide (e.g., GaAs), gallium arsenide indium (e.g., GaAsIn), some other suitable group III-V material, or any combination of the foregoing. The group II-VI material may, for example, be or comprise zinc oxide (e.g., ZnO), magnesium oxide (e.g., MgO), gadolinium oxide (e.g., GdO), some other suitable II-VI material, or any combination of the foregoing. In some embodiments, the dielectric structure 404 may be or comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or some other suitable dielectric material(s). In some embodiments, the pair of source/drain contacts 406 is or aluminum, titanium, tantalum, tungsten, gold, ruthenium, some other suitable conductive material(s), or any combination of the foregoing.

Figure 5:
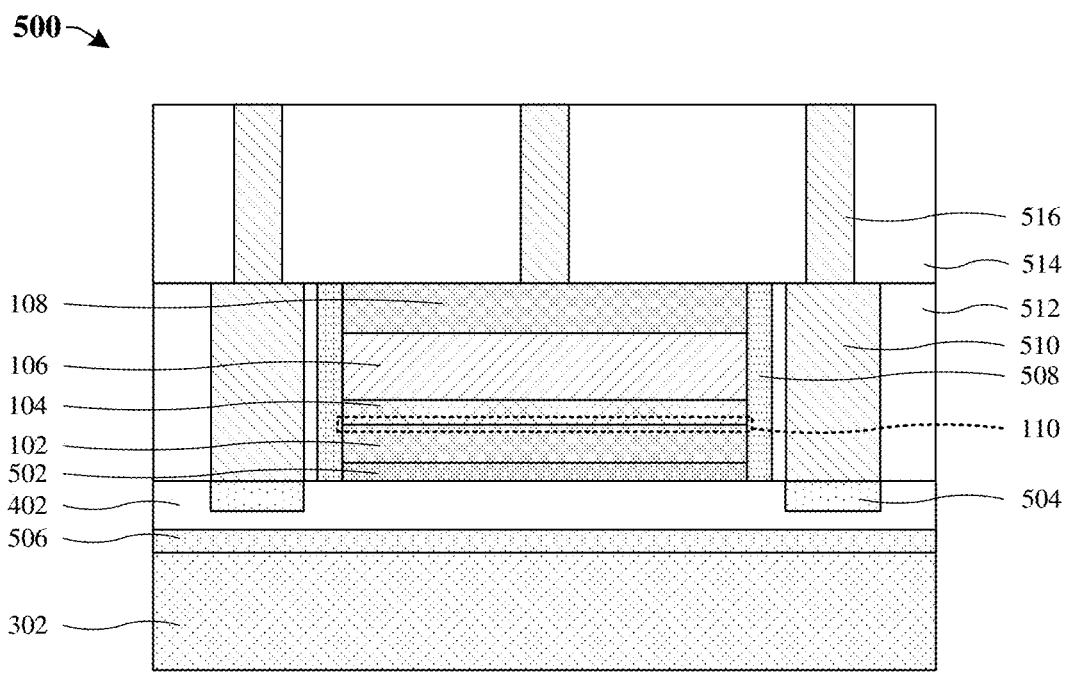
FIG. 5 illustrates a cross-sectional view of some embodiments of an IC in which a top gate FeFET structure comprises a seed layer.

FIG. 5 illustrates a cross-sectional view 500 of some embodiments of an IC in which a top gate FeFET structure comprises a seed layer 104. A ferroelectric layer 106, the seed layer 104, a semiconductor layer 402, an insulating layer 502, a first electrode 102, and a second electrode 108 are vertically stacked over a substrate 302, such that the first electrode 102 is disposed over the semiconductor layer 402, the second electrode 108 is disposed over the first electrode 102, the ferroelectric layer 106 is disposed between the first electrode 102 and the second electrode 108, the seed layer 104 is disposed between the first electrode 102 and the ferroelectric layer 106, and the insulating layer 502 is disposed between the first electrode 102 and the semiconductor layer 402.

The insulating layer 502 inhibits oxygen vacancies that can result in a leakage current. The reduced oxygen vacancies inhibit scattering of current in the semiconductor layer 402 and/or reduce reliability issues from negative bias temperature instability and positive bias temperature instability. The seed layer 104 promotes the formation of orthorhombic phase crystals in the ferroelectric layer 106 and/or inhibits the monoclinic phase in the ferroelectric layer 106 such that the orthorhombic phase dominates in the ferroelectric layer 106. Since the orthorhombic phase dominates, the ferroelectric layer 106 has a strong remanent polarization.

In some embodiments, the top gate FeFET structure is a columnar structure, such that the insulating layer 502, the first electrode 102, the seed layer 104, the ferroelectric layer 106, and the second electrode 108 define a columnar gate stack. In some embodiments, sidewalls of the first electrode 102, the seed layer 104, the ferroelectric layer 106, and the second electrode 108 are vertically aligned and laterally between sidewalls of the substrate 302. A pair of source/drain contacts 510 are laterally separated and disposed on doped regions 504 of the semiconductor layer 402 respectively on opposite sides of the columnar gate stack. The pair of source/drain contacts 510 are disposed on a same side of the semiconductor layer 402 as the first electrode 102. In some embodiments, the first electrode 102 is electrically floating.

In some embodiments, sidewalls of the source/drain contacts 510 are surrounded by a first inter-layer dielectric (ILD) structure 512. In some embodiments, sidewalls of the columnar gate stack are separated from the pair of source/drain contacts 510 by a spacer structure 508. In some embodiments, the spacer structure 508 continuously extends from a top surface of the second electrode 108 to a top surface of the semiconductor layer 402. In some embodiments, a plurality of contacts 516 are disposed in a second ILD structure 514 overlying the second electrode 108 and the pair of source/drain contacts 510. The plurality of contacts 516 are electrically coupled to the pair of source/drain contacts 510 and the second electrode 108.

The top gate FeFET structure operates similar to the bottom gate FeFET structure of FIG. 4. The remanent polarization of the ferroelectric layer 106 is employed to represent a bit of data. To write, a set voltage or a reset voltage is applied from the second electrode 108 to the semiconductor layer 402 (e.g., via the pair of source/drain contacts 510). The set voltage sets the remanent polarization of the ferroelectric layer 106 to the first state (e.g., a logical '1'), whereas the reset voltage sets the remanent polarization to the second state (e.g., a logical '0'). The threshold voltage varies with the state of the remanent polarization. Therefore, to read, a read voltage less than the coercive voltage and between the different threshold voltage states is applied from the second electrode 108 to the source one of the source/drain contacts 510. Depending on whether the semiconductor layer 402 conducts, the remanent polarization is in the first or second state. In some embodiments, the first electrode 102 changes the effective area of the ferroelectric layer 106, such that the remanent polarization may be saturated at a lower voltage.

An inter-diffusion region 110 is disposed between the seed layer 104 and the first electrode 102. In some embodiments, the seed layer 104 may have a non-uniform oxygen distribution. In further embodiments, the non-uniform oxygen distribution of the seed layer 104 is such that a concentration of oxygen is greater near the first electrode 102. Hence, in some embodiments, oxygen ions may enter the inter-diffusion region 110 from the seed layer 104 and recombine with defects (e.g., oxygen vacancies). In doing so, in some embodiments, the inter-diffusion region 110 may prevent charges from being formed at an interface of the seed layer 104 and the first electrode 102, positively impacting device performance.

A buffer layer 506 is disposed between the semiconductor layer 402 and the substrate 302, and is configured to separate the semiconductor layer 402 from the substrate 302 to accommodate a difference in their crystallographic structures. In some embodiments, the buffer layer 506 is or comprises silicon, gallium, a group III-V material, some other suitable material(s) that provide(s) a transition from lattice constants of the substrate 302 to lattice constants of the semiconductor layer 402, or a combination of the foregoing.

In some embodiments, the first ILD structure 512 and the second ILD structure 514 are or comprise, for example, nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the pair of source/drain contacts 510 and the plurality of contacts 516 are or otherwise comprise, for example, aluminum, titanium, tantalum, tungsten, gold, ruthenium, some other suitable conductive material(s), or any combination of the foregoing. In some embodiments, the spacer structure 508 and the insulating layer 502 are or comprise silicon nitride, silicon dioxide, some other suitable dielectric material(s), or a combination of the foregoing.

FIGS. 6, 7A-7C, and 8-11 illustrate a series of cross-sectional views 600, 700A-700C, and 800-1100 of some embodiments of a method for forming an IC in which a 1T1C memory structure comprises the MFM structure of FIG. 1. Although FIGS. 6, 7A-7C, and 8-11 are described in relation to a method, it will be appreciated that the structures disclosed in FIGS. 6, 7A-7C, and 8-11 are not limited to such a method, but instead may stand alone as structures independent of the method.

Figure 6:
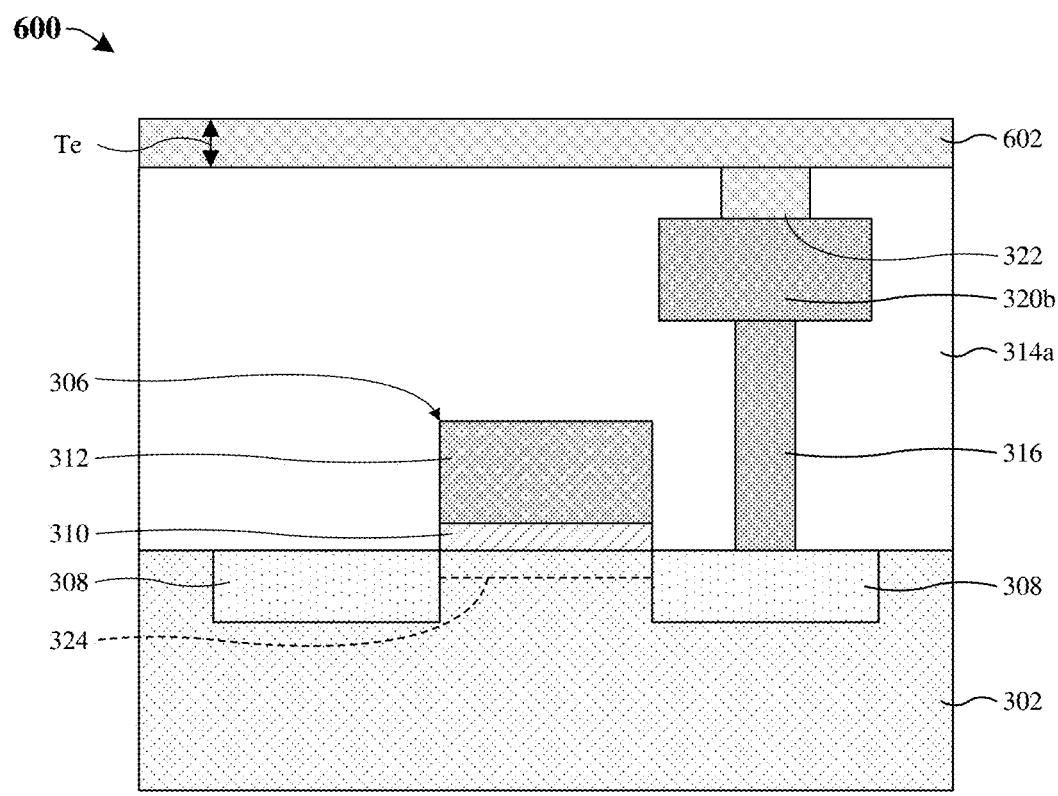
FIGS. 6, 7A-7C, and 8-11 illustrate a series of cross-sectional views of some embodiments of a method for forming an IC in which a 1T1C memory structure comprises the MFM structure of FIG. 1.

As illustrated by the cross-sectional view 600 of FIG. 6, an access device 306 is formed on a substrate 302. The access device 306 comprises a pair of source/drain regions 308, a gate dielectric layer 310, and a gate electrode 312. A lower interconnect dielectric layer 314a is formed over the access device 306. Further, a lower interconnect structure is formed in the lower interconnect dielectric layer 314a. The lower interconnect structure comprises a contact via 316, a bottom wire 320b overlying the contact via 316, and a bottom electrode via (BEVA) 322 overlying the bottom wire 320b. A first electrode layer 602 is formed over the BEVA 322. The first electrode layer 602 has a thickness Te ranging from approximately 10 nanometers to approximately 100 nanometers, approximately 10 nanometers to approximately 50 nanometers, approximately 50 nanometers to approximately 100 nanometers, or some other suitable value.

A process for forming the first electrode layer 602 may be or comprise depositing the first electrode layer 602 by direct current (DC) sputtering, physical vapor deposition (PVD), chemical vapor deposition (CVD), atomic layer deposition (ALD), some other suitable deposition process, or any combination of the foregoing. In some embodiments, the first electrode layer 602 is as described with regard to the first electrode 102 of FIG. 1. In alternative embodiments, the process of FIG. 6 may be repeated to form a first material (not shown) and a second material (not shown) to form a bi-layer electrode (not shown). In some of such embodiments, the bi-layer electrode may be as described with respect to the first electrode 202 of FIG. 2. In some embodiments, the first electrode layer 602 is or comprises titanium nitride (e.g., TiN), tantalum nitride (e.g., TaN), titanium (e.g., Ti), tantalum (e.g., Ta) tungsten (e.g., W), zirconium (e.g., Zr), some other suitable metal(s), or any alloy or combination of the foregoing.

Figure 7A:
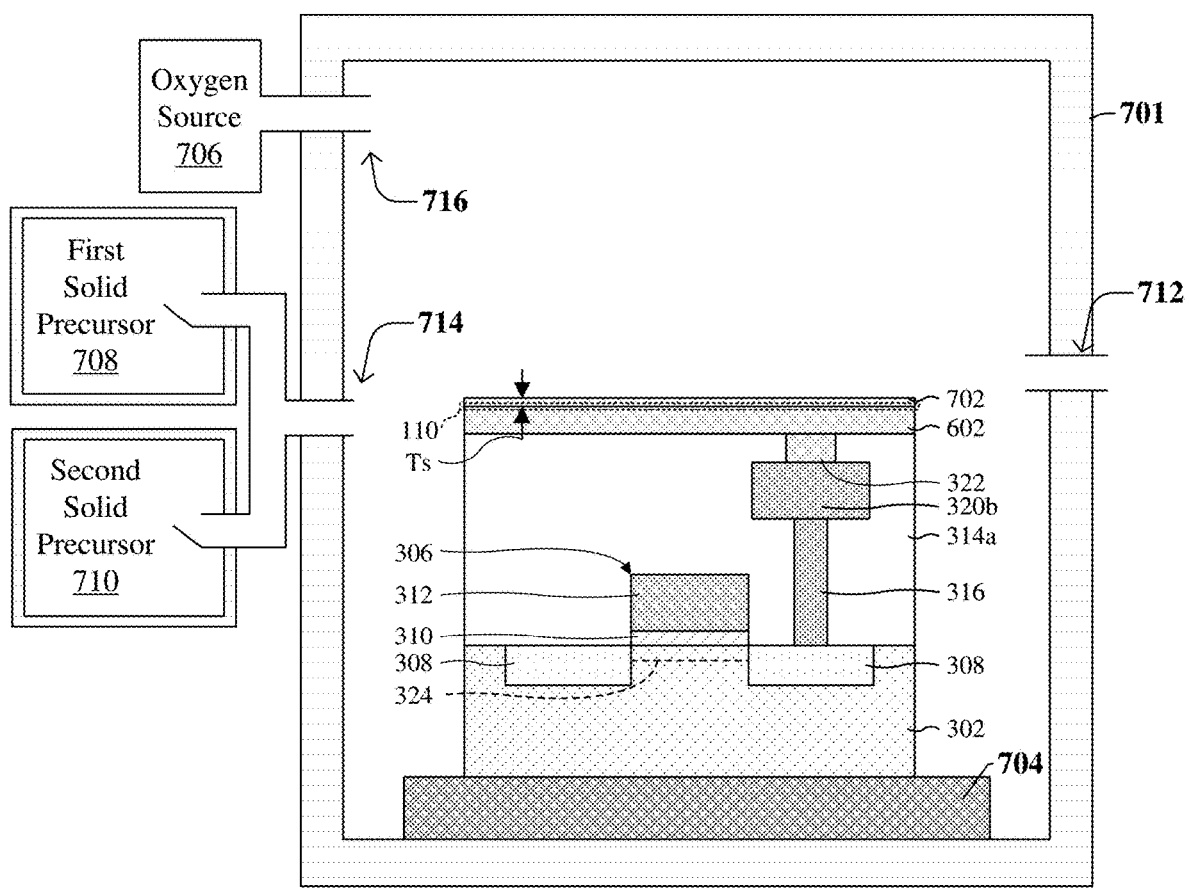
Figure 7B:
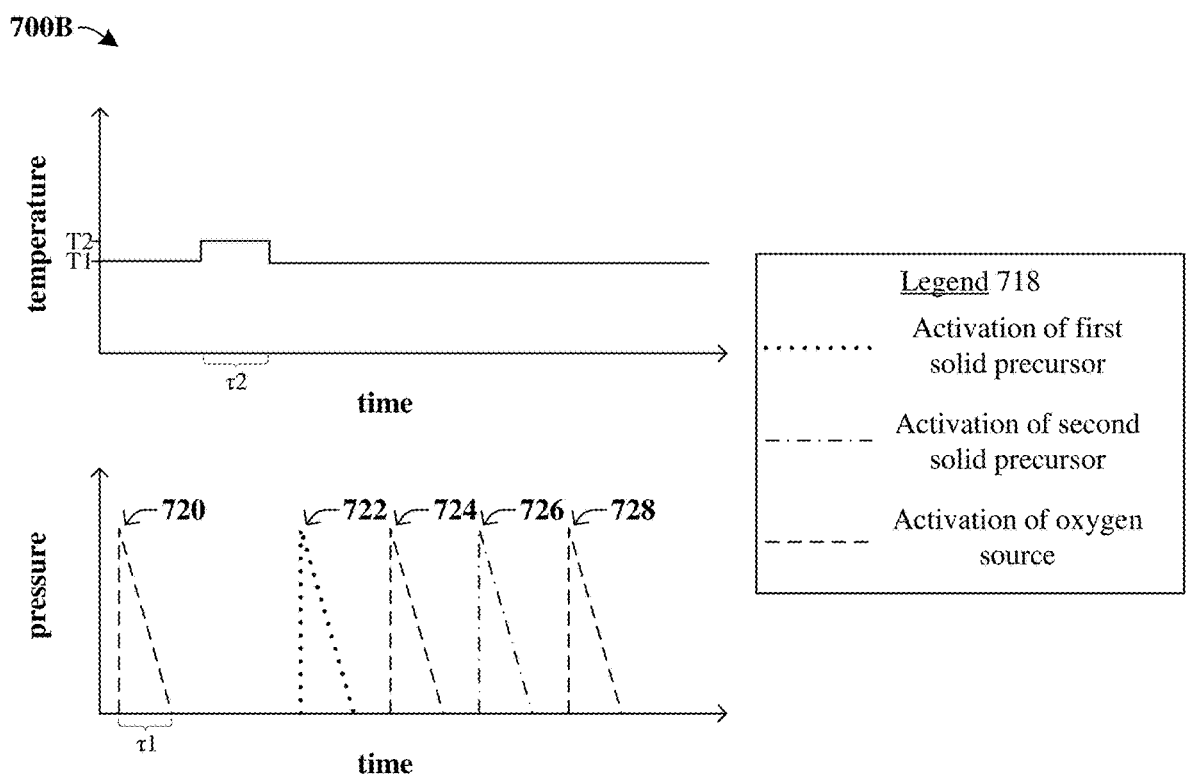
Figure 7C:
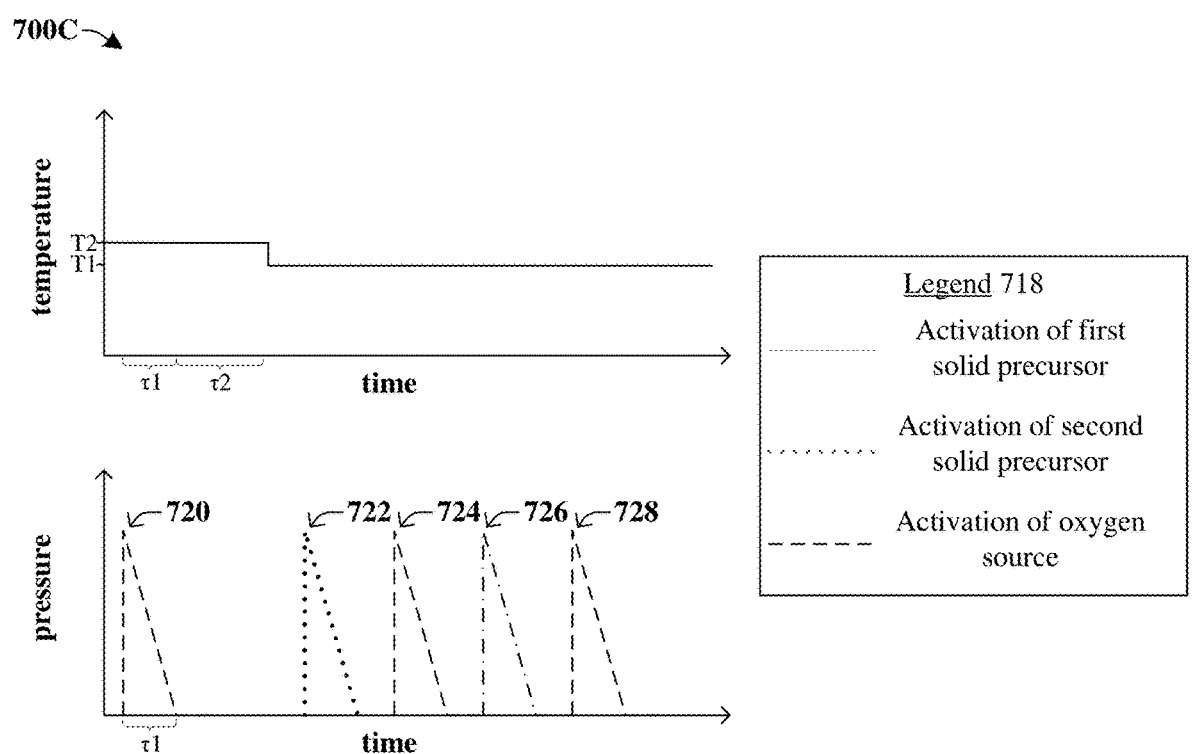

As illustrated by the cross-sectional view 700A of FIG. 7A, in some embodiments, the substrate 302 is transferred onto a wafer chuck 704 within a process chamber defined by chamber housing 701. In some embodiments, the process chamber is an atomic layer deposition (ALD) chamber, low pressure vessel, and/or the like. In some embodiments, a first gas inlet line 714 passes through the chamber housing 701 such that precursor vessels defined by vessel housings (e.g., 708, 710) are coupled to the process chamber through the first gas inlet line 714. In some embodiments, a second gas inlet line 716 passes through the chamber housing 701 such that an oxygen source 706 can enter the process chamber. In some embodiments, a gas outlet line 712 passes through the chamber housing 701 such that various gases can exit the process chamber during deposition processes.

In some embodiments, a seed structure 702 is formed over the first electrode layer 602 by way of a thermal process. The thermal process causes the seed structure 702 to be formed to have a predominantly crystalline phase. In some embodiments, the seed structure 702 may be formed according to the timing diagram 700B and the legend 718 of FIG. 7B, such that a first atomic layer deposition (ALD) pulse 720 is performed. In some embodiments, performing the first ALD pulse 720 comprises turning "ON" the oxygen source 706, allowing oxygen atoms to enter the process chamber at a first temperature T1. After a first time period τ1, the oxygen source 706 is turned "OFF" and the first electrode layer 602 undergoes a heating process. In some embodiments, the heating process comprises heating the process chamber to a second temperature T2 for a second time period τ2, causing the oxygen atoms in the process chamber to react with a top surface of the first electrode layer 602, forming the seed structure 702 over the first electrode layer 602. In some embodiments, the first ALD pulse 720 is performed according to the timing diagram 700C and the legend 718 of FIG. 7C, such that the heating process is performed on the first electrode layer 602 during the first ALD pulse. The oxygen source 706 is turned "ON" and oxygen atoms enter the process chamber at the second temperature T2, causing the oxygen atoms in the process chamber to react with a top surface of the first electrode layer 602, forming the seed structure 702 over the first electrode layer 602. After the first time period τ1, the oxygen source 706 is turned "OFF" and after the second time period τ2, the process chamber is cooled to the first temperature T1. In alternative embodiments, the process chamber may be cooled to a third temperature (not shown) different than the first temperature T1.

The seed structure 702 promotes growth of orthorhombic phase crystals in a subsequently formed ferroelectric structure and/or inhibits growth of monoclinic phase crystals in the ferroelectric structure, which increases the remanent polarization of the ferroelectric structure. Thus, the performance of the memory structure may be improved without undergoing the slow and costly process of providing a precursor to form the seed structure 702, avoiding the presence of remaining precursor in unwanted areas of the memory structure. Additionally, this process results in the seed structure 702 having a non-uniform oxygen concentration, such that oxygen is more concentrated near the first electrode layer 602. Hence, oxygen ions may enter an inter-diffusion region 110 between the seed structure 702 and the first electrode layer 602 and recombine with defects (e.g., oxygen vacancies) to reduce the number of defects in the inter-diffusion region 110. In doing so, the presence of the inter-diffusion region 110 may prevent charges from being formed at the interface of the seed structure 702 and the first electrode layer 602, positively impacting device performance.

In some embodiments, the first temperature T1 may range from approximately 250 degrees Celsius to approximately 350 degrees Celsius, approximately 250 degrees Celsius to approximately 300 degrees Celsius, approximately 300 degrees Celsius to approximately 350 degrees Celsius, or some other suitable value. In some embodiments, the second temperature T2 may range from approximately 400 degrees Celsius to approximately 700 degrees Celsius, approximately 400 degrees Celsius to approximately 550 degrees Celsius, approximately 550 degrees Celsius to approximately 700 degrees Celsius, or some other suitable value. In some embodiments, the first time period τ1 may range from approximately 0.1 seconds to approximately 10 seconds, approximately 0.1 seconds to approximately 5 seconds, approximately 5 seconds to approximately 10 seconds, or some other suitable value. In some embodiments, the second time period τ2 may range from approximately 60 seconds to approximately 300 seconds, approximately 60 seconds to approximately 180 seconds, approximately 180 seconds to approximately 300 seconds, or some other suitable value.

In some embodiments, the seed structure 702 is formed to have a thickness Ts ranging from approximately 0.5 nanometers to approximately 5 nanometers, approximately 0.5 nanometers to approximately 2 nanometers, approximately 2 nanometers to approximately 5 nanometers, or some other suitable value. In some embodiments, if the thickness Ts is too large (e.g., greater than approximately 5 nanometers), increased resistance of the seed structure 702 may degrade power efficiency and shift operating parameters out of specification. If the thickness Ts is too small (e.g., less than approximately 0.5 nanometers), the seed structure 702 may fail to sufficiently promote orthorhombic phase crystal growth in a subsequently formed ferroelectric layer. In some embodiments, the seed structure 702 is an oxide or an oxynitride comprising a same material as the first electrode layer 602. In some embodiments, the seed structure 702 is as described with regard to the seed layer 104 of FIG. 1.

In some embodiments, the substrate 302 was already in the process chamber during the formation of the first electrode layer 602 forming in FIG. 6, such that forming the seed structure 702 is performed in-situ with performing the first ALD pulse 720 on the first electrode layer 602. The in-situ thermal process results in the seed structure 702 having a higher uniformity of crystalline phase (e.g., a higher uniformity of tetragonal crystalline phase, a higher uniformity of orthorhombic crystalline phase, etc.) than other deposition processes that use a precursor. For example, forming a seed structure by way of an ALD process may result in a higher percentage of the seed structure being amorphous than the thermal process. In some embodiments, the in-situ thermal process may cause the seed structure 702 to have a predominant crystalline phase. The higher uniformity of crystalline phase promotes a higher percentage of orthorhombic crystalline phase within the subsequently formed ferroelectric structure, which results in a larger memory read window and hence more resilient memory read operations.

While the seed structure 702 is described as being formed in the process chamber, it should be appreciated that in alternative embodiments, the seed structure 702 may be formed in a separate furnace, by rapid thermal anneal (RTA), or the like. In some embodiments, the oxygen source may be or comprise, for example, water, ozone, oxygen gas, or some other suitable oxygen source(s).

Figure 8:
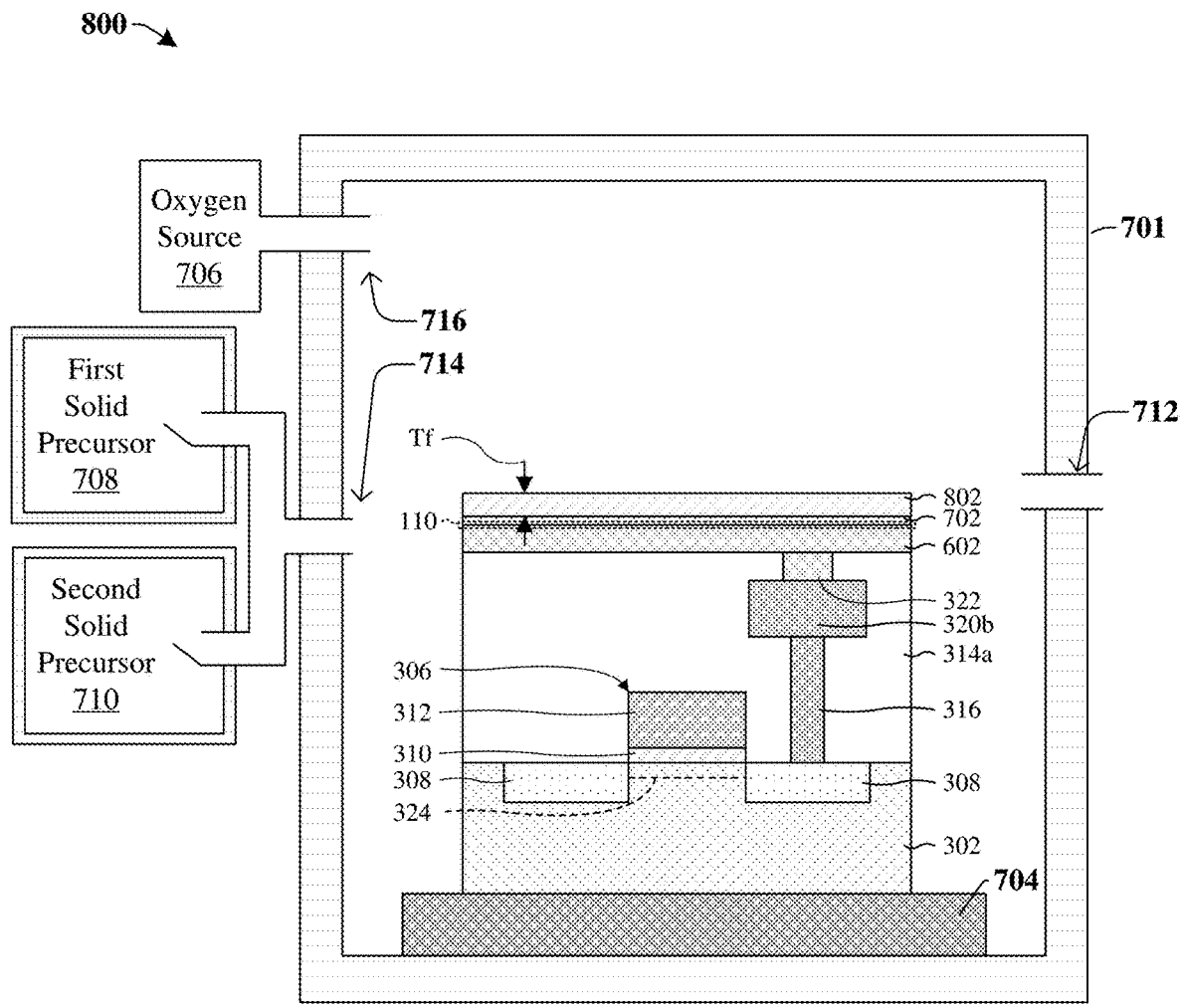

As illustrated by the cross-sectional view 800 of FIG. 8, a ferroelectric structure 802 is formed over the seed structure 702. Because of the crystalline phase of the seed structure 702, the ferroelectric structure 802 may be formed to have a predominantly (e.g., substantially uniform) orthorhombic crystalline phase. In some embodiments, the ferroelectric structure 802 may be formed in-situ with the seed structure 702. In some embodiments, the ferroelectric structure 802 may be formed according to the timing diagram 700B and the legend 718 of FIG. 7B or the timing diagram 700C and the legend 718 of FIG. 7C, such that a plurality of formation cycles is performed. In some embodiments, respective formation cycles of the plurality of formation cycles comprise performing a series of ALD pulses at the first temperature T1. In alternative embodiments, the series of ALD pulses may be performed at the third temperature (not shown). In some embodiments, performing the series of ALD pulses comprises performing a second ALD pulse 722, a third ALD pulse 724, a fourth ALD pulse 726, and a fifth ALD pulse 728. In some embodiments, performing the second ALD pulse 722 comprises activating a first solid precursor 708, such that atoms of the first solid precursor 708 enter the process chamber. In some embodiments, the third ALD pulse 724 comprises turning "ON" the oxygen source 706, allowing oxygen atoms to enter the process chamber. The oxygen atoms react with the atoms from the first solid precursor 708 to partially form the ferroelectric structure 802. In some embodiments, performing the fourth ALD pulse 726 comprises activating a second solid precursor 710, such that atoms of the second solid precursor 710 enter the process chamber. In some embodiments, the fifth ALD pulse 728 comprises turning "ON" the oxygen source 706, allowing oxygen atoms to enter the process chamber. The oxygen atoms react with the atoms from the second solid precursor 710 to form the ferroelectric structure 802. The oxygen source 706 is then turned "OFF".

By forming the seed structure 702 using an in-situ thermal process, the seed structure 702 has a higher uniformity of crystalline phase than other deposition processes that use a precursor. The higher uniformity of crystalline phase in the seed structure 702 promotes a uniform higher percentage of orthorhombic crystalline phase within the ferroelectric structure 802. Because the orthorhombic phase exhibits a stronger remanent polarization than other crystalline phases, the in-situ ALD process improves a performance of the ferroelectric structure 802 due to a larger difference (e.g., 2Pr) in remanent polarization between the first state and the second state, which results in a larger memory read window and hence more resilient memory read operations. In some embodiments, since the seed structure 702 has a higher uniformity of crystalline phase than other deposition processes that use a precursor, the ferroelectric structure 802 has a substantially uniform orthorhombic crystalline phase. In some embodiments, the presence of the seed structure 702 causes the series of ALD pulses to form the ferroelectric structure 802 to have a predominately orthorhombic crystalline phase.

In some embodiments, the ferroelectric structure 802 is formed to have a thickness Tf ranging from approximately 1 nanometer to approximately 100 nanometers, approximately 1 nanometer to approximately 20 nanometers, approximately 20 nanometers to approximately 30 nanometers, approximately 50 nanometers to approximately 100 nanometers, or some other suitable value. In some embodiments, if the thickness Tf is too large (e.g., greater than approximately 100 nanometers), the ferroelectric structure 802 may become thermodynamically unstable in the orthorhombic crystalline phase, thereby decreasing remanent polarization. If the thickness Tf is too small (e.g., less than approximately 1 nanometer), the ferroelectric structure 802 may provide an insufficient amount of remanent polarization to store data reliably. In some embodiments, the second ALD pulse, the third ALD pulse, the fourth ALD pulse, and the fifth ALD pulse may be repeated one or more times to increase the thickness Tf of the ferroelectric structure 802.

In some embodiments, the first solid precursor 708 and the second solid precursor 710 are activated by turning "ON" an inert gas source (not shown). In some embodiments, the inert gas source may be or comprise, for example, nitrogen gas, argon gas, hydrogen gas, a combination thereof, or some other suitable gas. In some embodiments, the first solid precursor 708 may be or comprise, for example, hafnium tetrachloride (e.g., $HfCl_4$) or some other suitable precursor material(s). In some embodiments, the second solid precursor 710 may be or comprise, for example, zirconium tetrachloride (e.g., $ZrCl_4$) or some other suitable precursor material(s).

Figure 9:
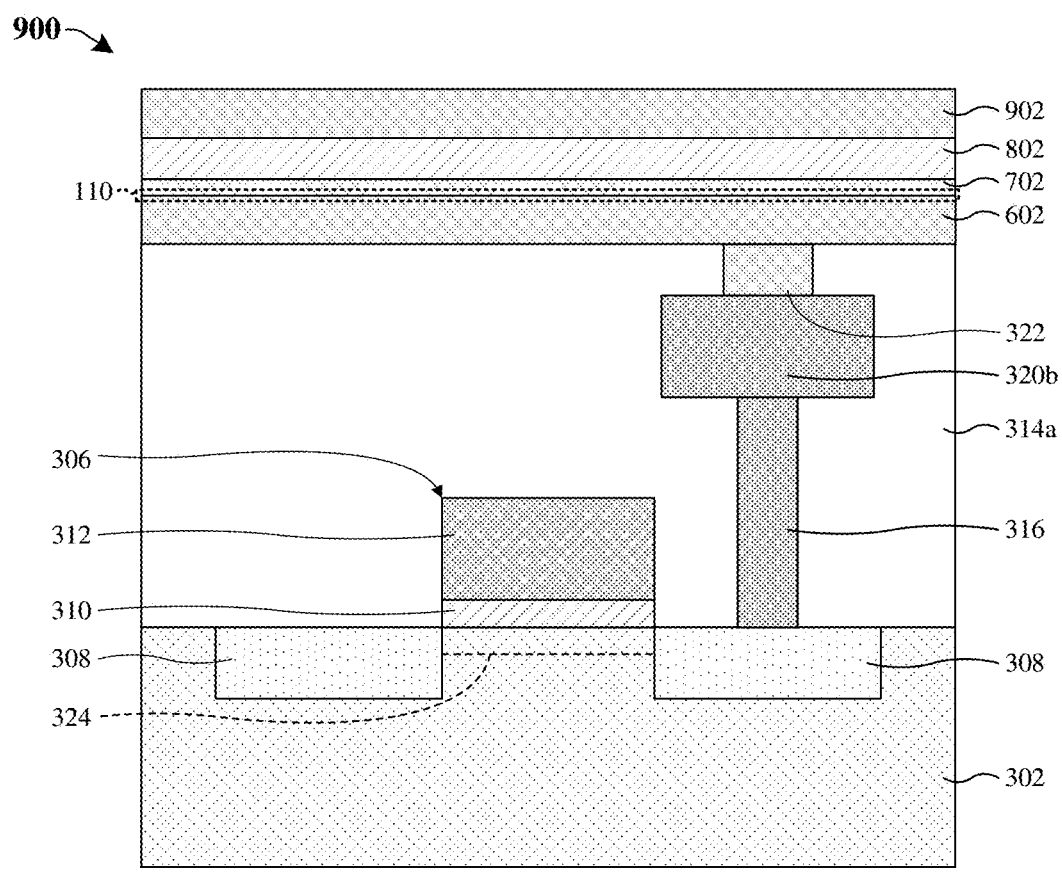

As illustrated by the cross-sectional view 900 of FIG. 9, a second electrode layer 902 is formed over the ferroelectric structure 802. A process for forming the second electrode layer 902 may be or comprise depositing the second electrode layer 902 by DC sputtering, PVD, CVD, ALD, some other suitable deposition process, or any combination of the foregoing. In some embodiments, the second electrode layer 902 has the thickness Te. In some embodiments, the second electrode layer 902 is as described with respect to the second electrode 108 of FIG. 1. While the second electrode layer 902 is shown as being formed outside of a process chamber, it should be appreciated that in some embodiments, the second electrode layer 902 is formed in the process chamber as described in FIGS. 7A-7C and 8.

Figure 10:
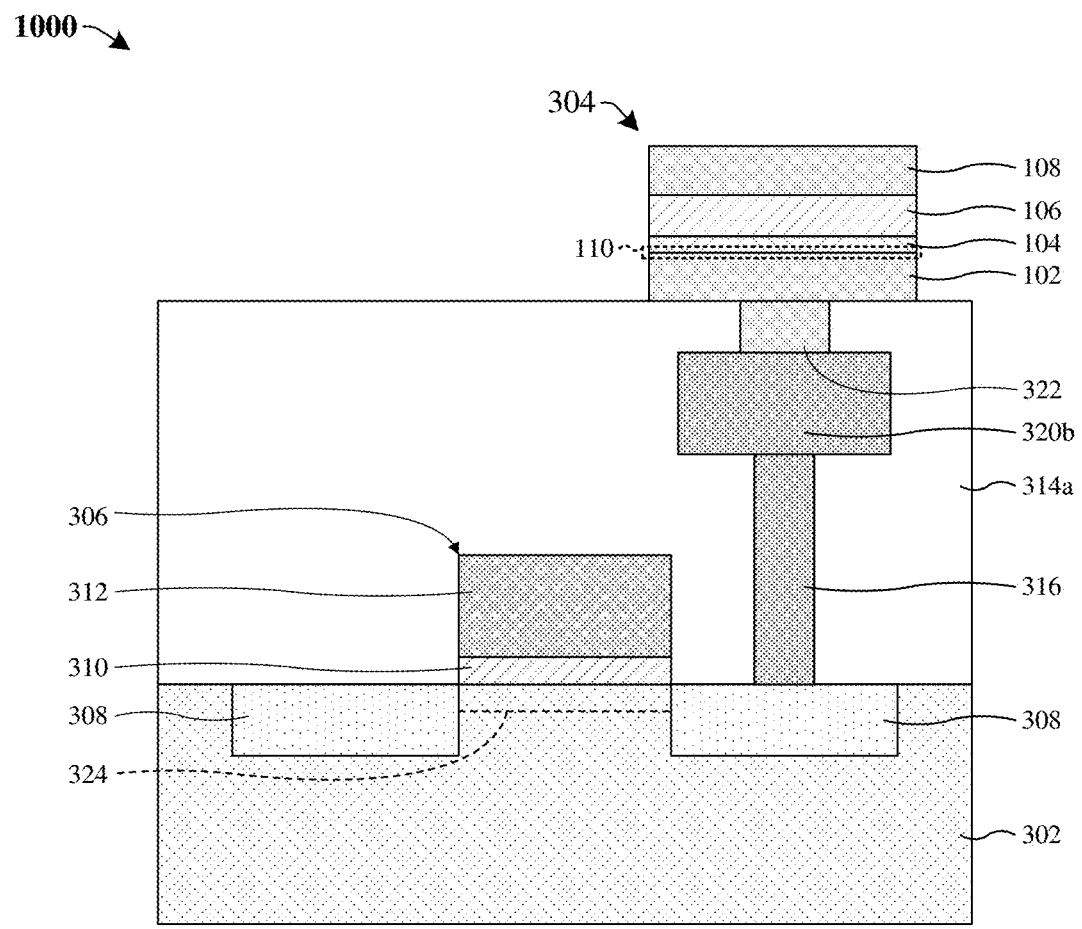

As illustrated by the cross-sectional view 1000 of FIG. 10, the first electrode layer 602, the seed structure 702, the ferroelectric structure 802, and the second electrode layer 902 are patterned to define a ferroelectric memory structure 304 respectively comprising a first electrode 102, a seed layer 104, a ferroelectric layer 106, and a second electrode 108. The patterning may, for example, be performed by a photolithography/etching process and/or by some other suitable process. In some embodiments, the patterning comprises: forming a hard mask (not shown) over the second electrode layer 902 using a photolithography/etching process and subsequently etching the first electrode layer 602, the seed structure 702, the ferroelectric structure 802, and the second electrode layer 902 with the hard mask in place.

Figure 11:
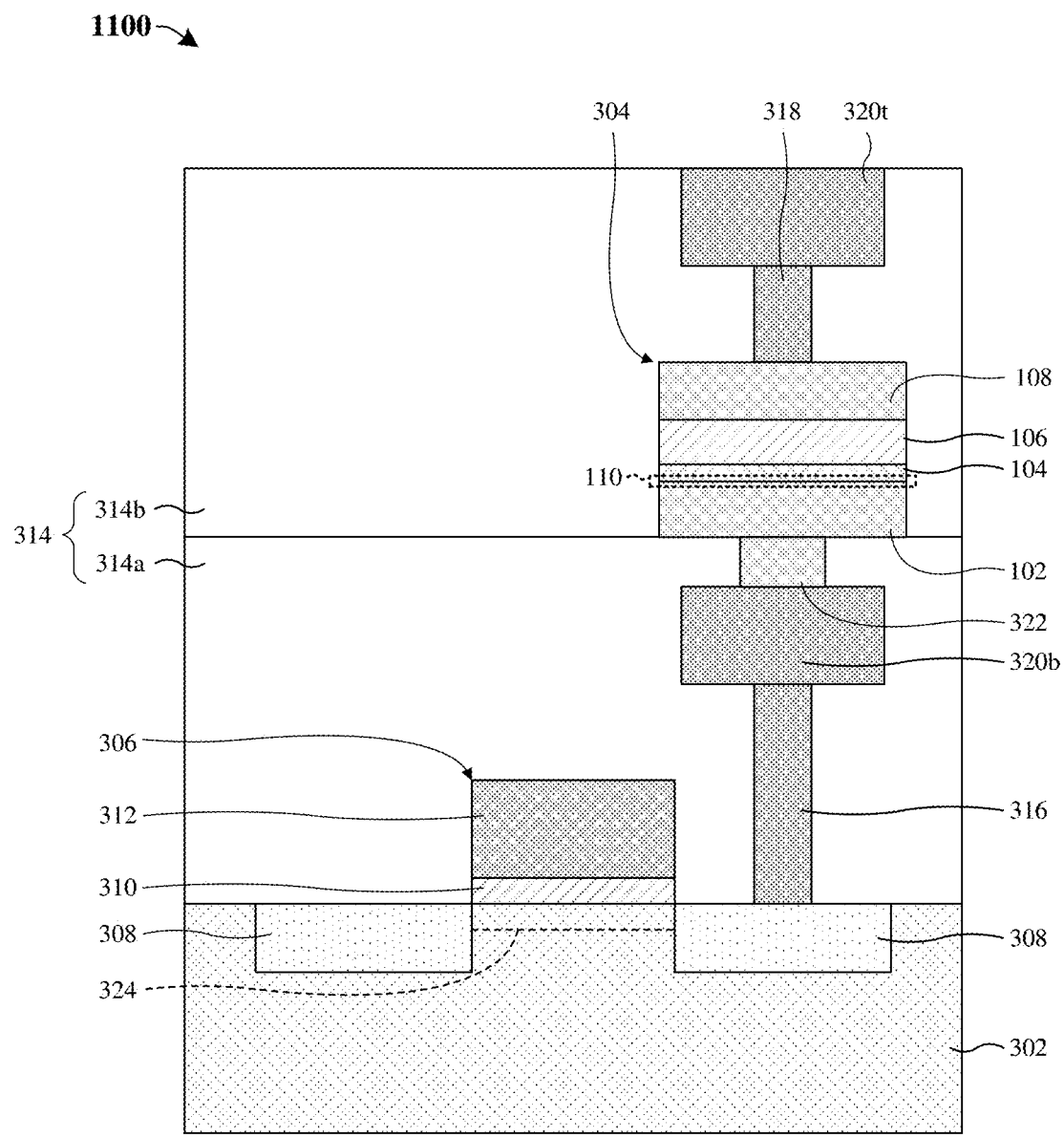

As illustrated by the cross-sectional view 1100 of FIG. 11, an upper interconnect dielectric layer 314b is formed over the lower interconnect dielectric layer 314a, such that the upper interconnect dielectric layer 314b and the lower interconnect dielectric layer 314a form an interconnect dielectric structure 314. Further, an upper interconnect structure is formed in the upper interconnect dielectric layer 314b. The upper interconnect structure comprises an interlevel via 318 overlying the ferroelectric memory structure 304 and further comprises a top wire 320t overlying the interlevel via 318.

Figure 12:
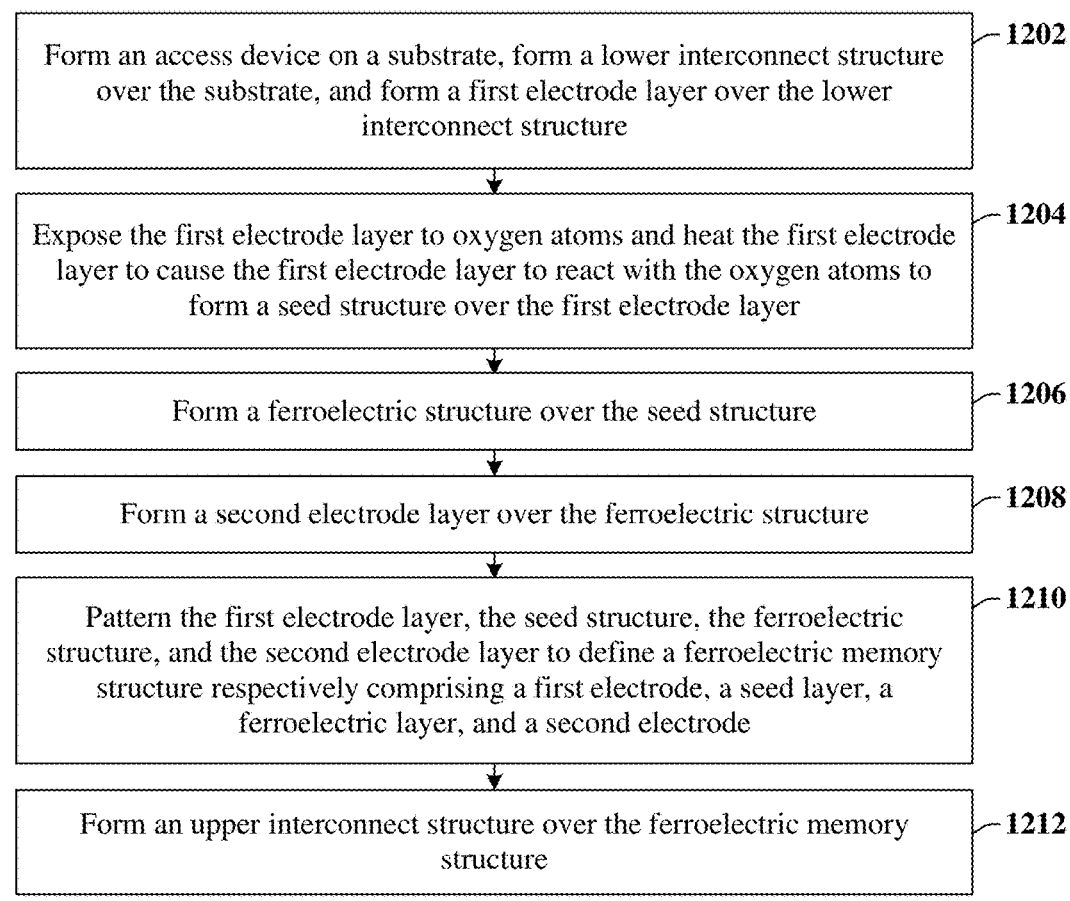
FIG. 12 illustrates a flow diagram of some embodiments of a method corresponding to the cross-sectional views of FIGS. 6, 7A-7C, and 8-11.

FIG. 12 illustrates a flow diagram 1200 of some embodiments of a method corresponding to the cross-sectional views of FIGS. 6, 7A-7C, and 8-11.

While the disclosed flow diagrams (e.g., 1200, 2000, and 3500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1202, an access device is formed on a substrate, a lower interconnect structure is formed over the substrate, and a first electrode layer is formed over the lower interconnect structure. See, for example, FIG. 6.

At act 1204, the first electrode layer is exposed to oxygen atoms and the first electrode layer is heated to cause the first electrode layer to react with the oxygen atoms to form a seed structure over the first electrode layer. See, for example, FIG. 7.

At act 1206, a ferroelectric structure is formed over the seed structure. See, for example, FIG. 8.

At act 1208, a second electrode layer is formed over the ferroelectric structure. See, for example, FIG. 9.

At act 1210, the first electrode layer, the seed structure, the ferroelectric structure, and the second electrode layer are patterned to define a ferroelectric memory structure respectively comprising a first electrode, a seed layer, a ferroelectric layer, and a second electrode. See, for example, FIG. 10.

At act 1212, an upper interconnect structure is formed over the ferroelectric memory structure. See, for example, FIG. 11.

FIGS. 13-19 illustrate a series of cross-sectional views 1300-1900 of some embodiments of a method for forming an IC in which a bottom gate FeFET structure comprises a seed layer 104. The IC may, for example, be as described with regard to FIG. 4. Although FIGS. 13-19 are described in relation to a method, it will be appreciated that the structures disclosed in FIGS. 13-19 are not limited to such a method, but instead may stand alone as structures independent of the method.

Figure 13:
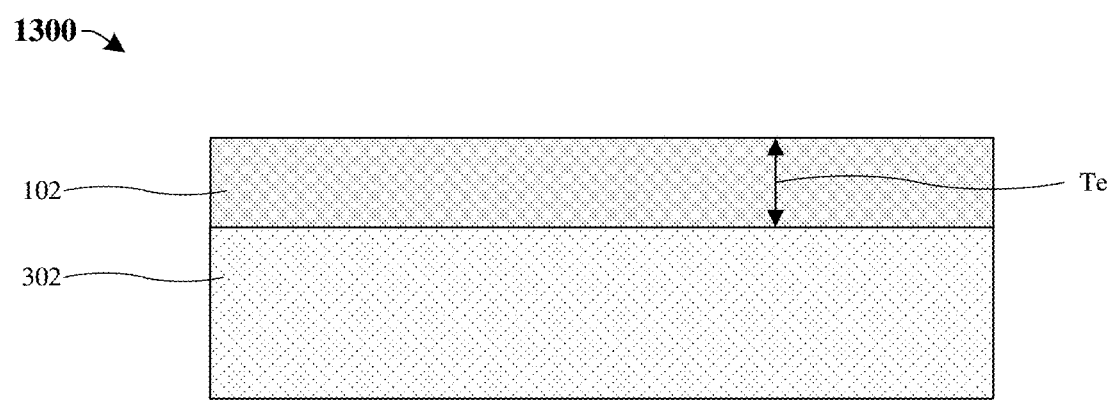
FIGS. 13-19 illustrate a series of cross-sectional views of some embodiments of a method for forming an IC in which a bottom gate FeFET structure comprises a seed layer.

As illustrated by the cross-sectional view 1300 of FIG. 13, a first electrode 102 is formed over a substrate 302. A process for forming the first electrode 102 may be or comprise depositing the first electrode 102 by DC sputtering, PVD, CVD, ALD, some other suitable deposition process, or any combination of the foregoing. In some embodiments, the first electrode 102 is as described with regard to FIG. 1. In some embodiments, the first electrode 102 is formed to have a thickness Te ranging from approximately 10 nanometers to approximately 100 nanometers, approximately 10 nanometers to approximately 50 nanometers, approximately 50 nanometers to approximately 100 nanometers, or some other suitable value.

Figure 14:
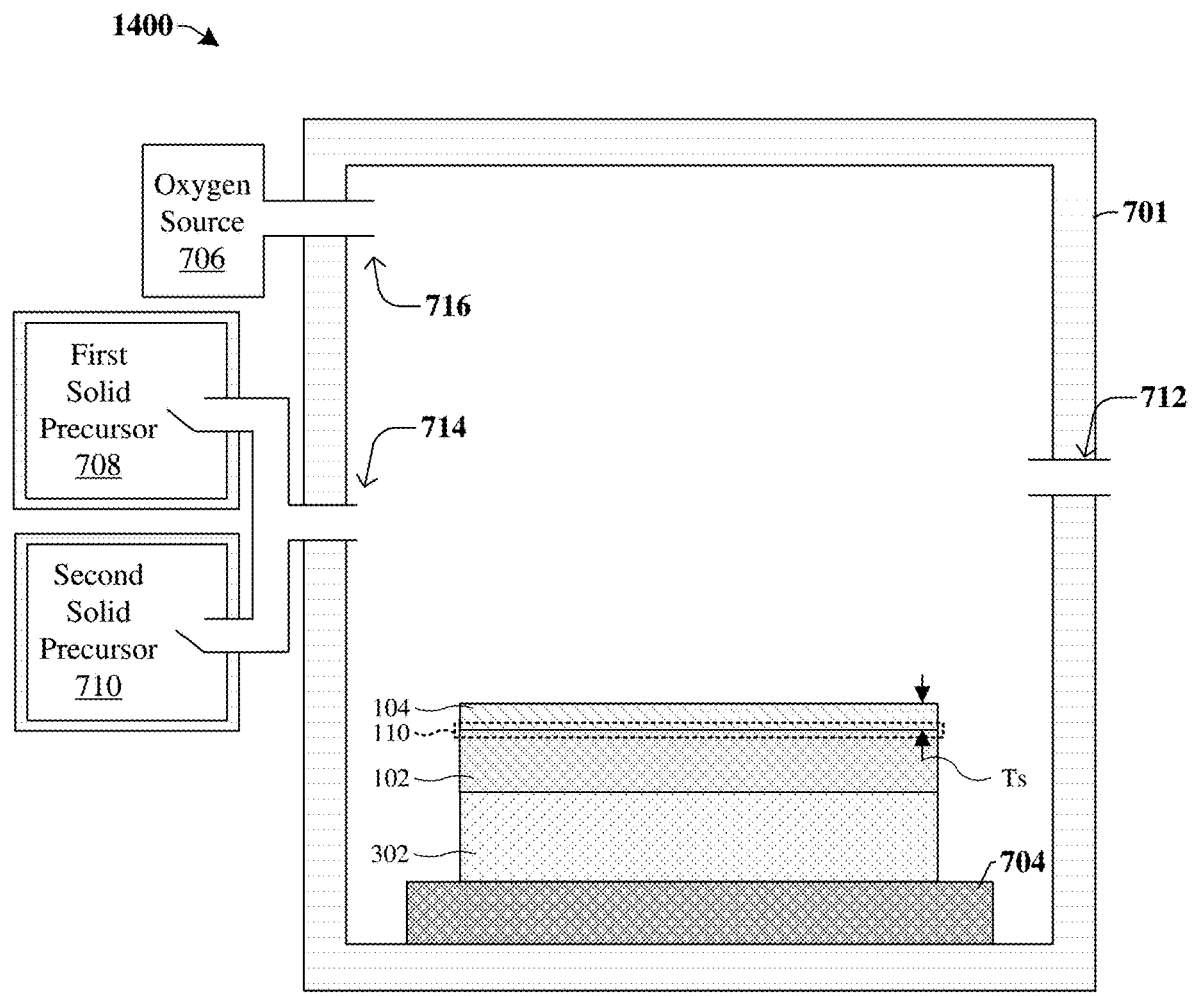

As illustrated by the cross-sectional view 1400 of FIG. 14, a seed layer 104 is formed over the first electrode 102. In some embodiments, the seed layer 104 is formed as described with regard to forming the seed structure 702 of FIG. 7. As such, in some embodiments, the substrate 302 may be placed in a process chamber, such that the seed layer 104 may be formed in the process chamber. In some embodiments, the substrate 302 was already in the process chamber during the formation of the first electrode 102 forming in FIG. 13, such that the seed layer 104 is formed in-situ. The in-situ thermal process results in the seed layer 104 having a higher uniformity of crystalline phase (e.g., a higher uniformity of tetragonal crystalline phase, a higher uniformity of orthorhombic crystalline phase, etc.) than other deposition processes that use a precursor. For example, forming a seed layer by way of an ALD process may result in a higher percentage of the seed layer being amorphous than the thermal process. In some embodiments, the in-situ thermal process may cause the seed layer 104 to have a predominant crystalline phase. The higher uniformity of crystalline phase promotes a higher percentage of orthorhombic crystalline phase within a subsequently formed ferroelectric layer, which results in a larger memory read window and hence more resilient memory read operations.

The seed layer 104 promotes growth of orthorhombic phase crystals in a subsequently formed ferroelectric layer and/or inhibits growth of monoclinic phase crystals in the ferroelectric layer, which increases the remanent polarization of the ferroelectric layer. Thus, the performance of the memory structure may be improved without undergoing the slow and costly process of providing a precursor to form the seed layer 104, avoiding the presence of remaining precursor in unwanted areas of the memory structure. Additionally, this process results in the seed layer 104 having a non-uniform oxygen concentration, such that oxygen is more concentrated near the first electrode 102. Hence, oxygen ions may enter an inter-diffusion region 110 between the seed layer 104 and the first electrode 102 and recombine with defects (e.g., oxygen vacancies) to reduce the number of defects in the inter-diffusion region 110. In doing so, the presence of the inter-diffusion region 110 may prevent charges from being formed at the interface of the seed layer 104 and the first electrode 102, positively impacting device performance.

In some embodiments, the seed layer 104 is formed to have a thickness Ts ranging from approximately 0.5 nanometers to approximately 5 nanometers, approximately 0.5 nanometers to approximately 2 nanometers, approximately 2 nanometers to approximately 5 nanometers, or some other suitable value. In some embodiments, if the thickness Ts is too large (e.g., greater than approximately 5 nanometers), increased resistance of the seed layer 104 may degrade power efficiency and shift operating parameters out of specification. If the thickness Ts is too small (e.g., less than approximately 0.5 nanometers), the seed layer 104 may fail to sufficiently promote orthorhombic phase crystal growth in a subsequently formed ferroelectric layer. In some embodiments, the seed layer 104 is an oxide or an oxynitride comprising a same material as the first electrode 102. In some embodiments, the seed layer 104 is as described with regard to FIG. 1.

Figure 15:
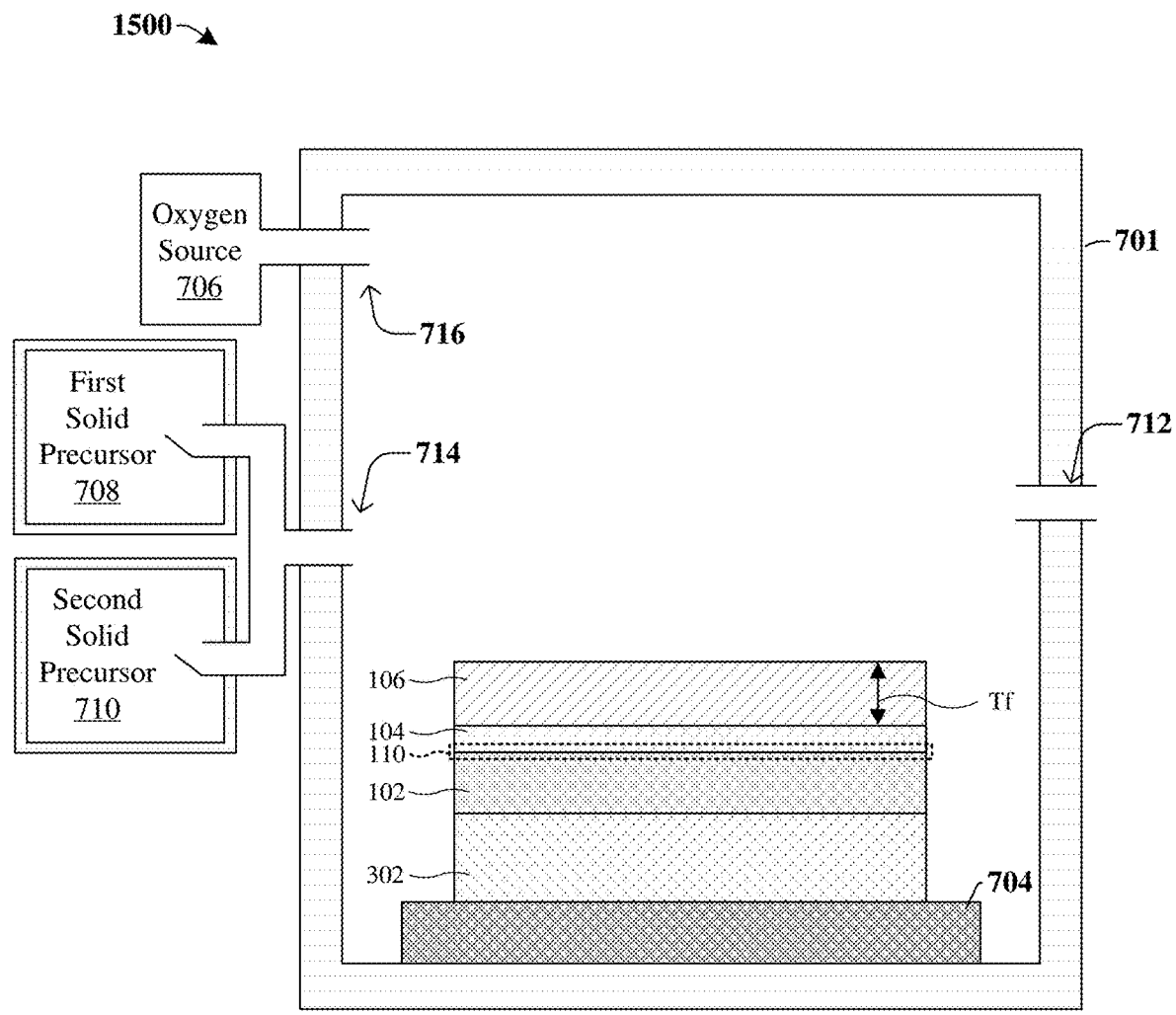

As illustrated by the cross-sectional view 1500 of FIG. 15, a ferroelectric layer 106 is formed over the seed layer 104. In some embodiments, the ferroelectric layer 106 is formed as described with regard to forming the ferroelectric structure 802 of FIG. 8. In some embodiments, the ferroelectric layer 106 has a thickness Tf ranging from approximately 1 nanometer to approximately 100 nanometers, approximately 1 nanometer to approximately 20 nanometers, approximately 20 nanometers to approximately 30 nanometers, approximately 50 nanometers to approximately 100 nanometers, or some other suitable value. In alternative embodiments, the ferroelectric structure 802 may be formed by a different deposition process such as ALD, CVD, PVD, or the like.

By forming the seed layer 104 using an in-situ thermal process, the seed layer 104 has a higher uniformity of crystalline phase than other deposition processes that use a precursor. The higher uniformity of crystalline phase in the seed layer 104 promotes a uniform higher percentage of orthorhombic crystalline phase within the ferroelectric layer 106. Because the orthorhombic phase exhibits a stronger remanent polarization than other crystalline phases, the in-situ ALD process improves a performance of the ferroelectric layer 106 due to a larger difference (e.g., 2Pr) in remanent polarization between the first state and the second state, which results in a larger memory read window and hence more resilient memory read operations. In some embodiments, since the seed layer 104 has a higher uniformity of crystalline phase than other deposition processes that use a precursor, the ferroelectric layer 106 has a substantially uniform orthorhombic crystalline phase. In some embodiments, the presence of the seed layer 104 causes the series of ALD pulses to form the ferroelectric layer 106 to have a predominately orthorhombic crystalline phase.

Figure 16:
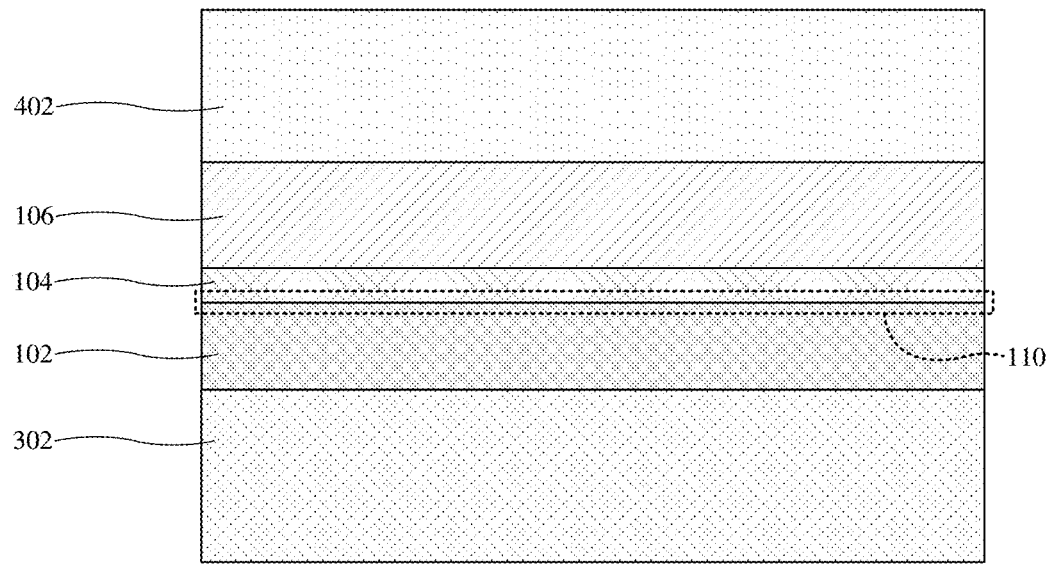

As illustrated by the cross-sectional view 1600 of FIG. 16, a semiconductor layer 402 is formed over the ferroelectric layer 106. A process for forming the semiconductor layer 402 may, for example, be or comprise depositing the semiconductor layer 402 by CVD, PVD, ALD, or some suitable process. In some embodiments, the semiconductor layer 402 is as described with regard to FIG. 4.

Figure 17:
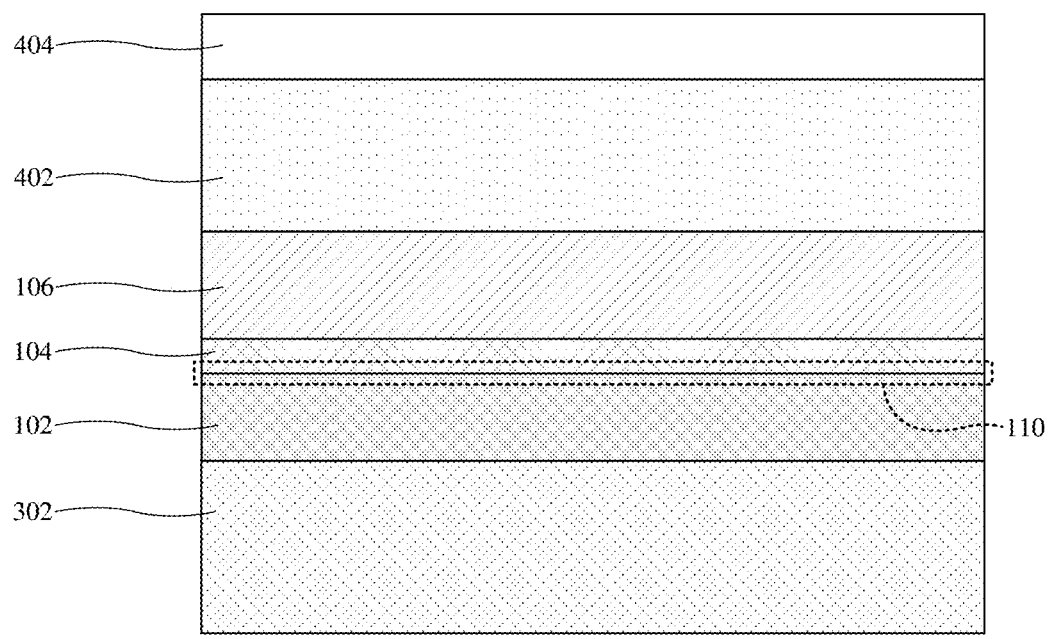

As illustrated by the cross-sectional view 1700 of FIG. 17, a dielectric structure 404 may be formed over the semiconductor layer 402. A process for forming the dielectric structure 404 may, for example, be or comprise depositing the dielectric structure 404 by CVD, PVD, ALD, or some suitable process. In some embodiments, the dielectric structure 404 is as described with regard to FIG. 4.

Figure 18:
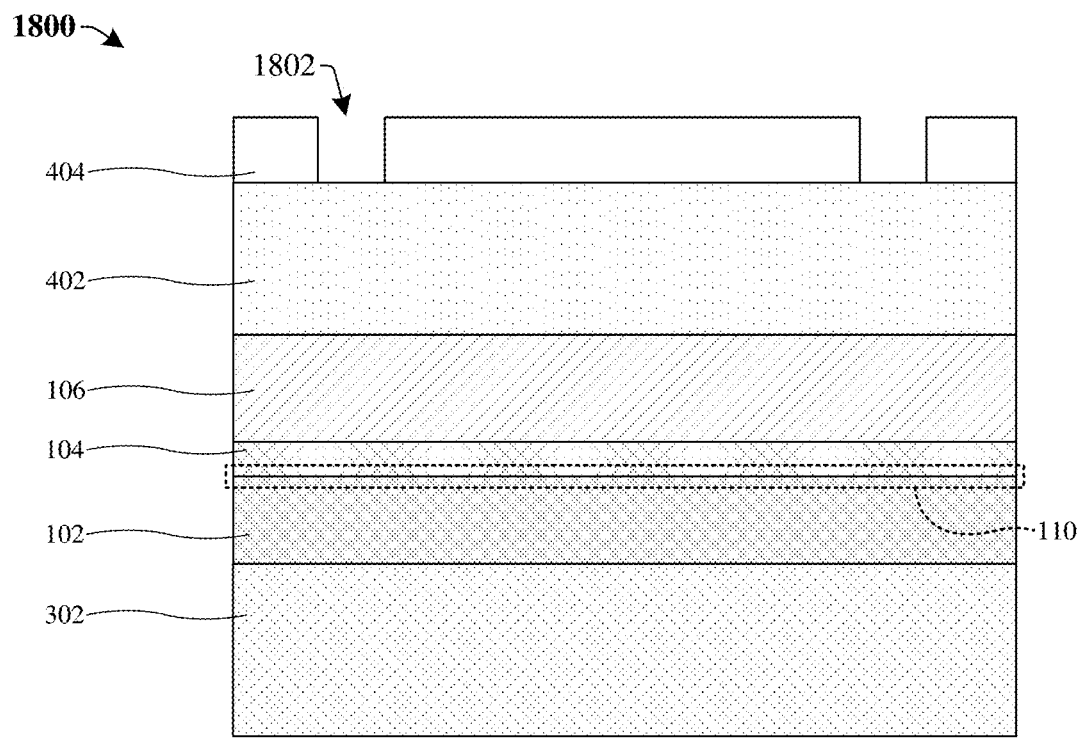

As illustrated by the cross-sectional view 1800 of FIG. 18, the dielectric structure 404 is patterned to form a pair of openings 1802 respectively exposing opposing ends of the semiconductor layer 402. In some embodiments, the patterning comprises: forming a hard mask (not shown) over the dielectric structure 404 using a photolithography/etching process and subsequently etching the dielectric structure 404 with the hard mask in place.

Figure 19:
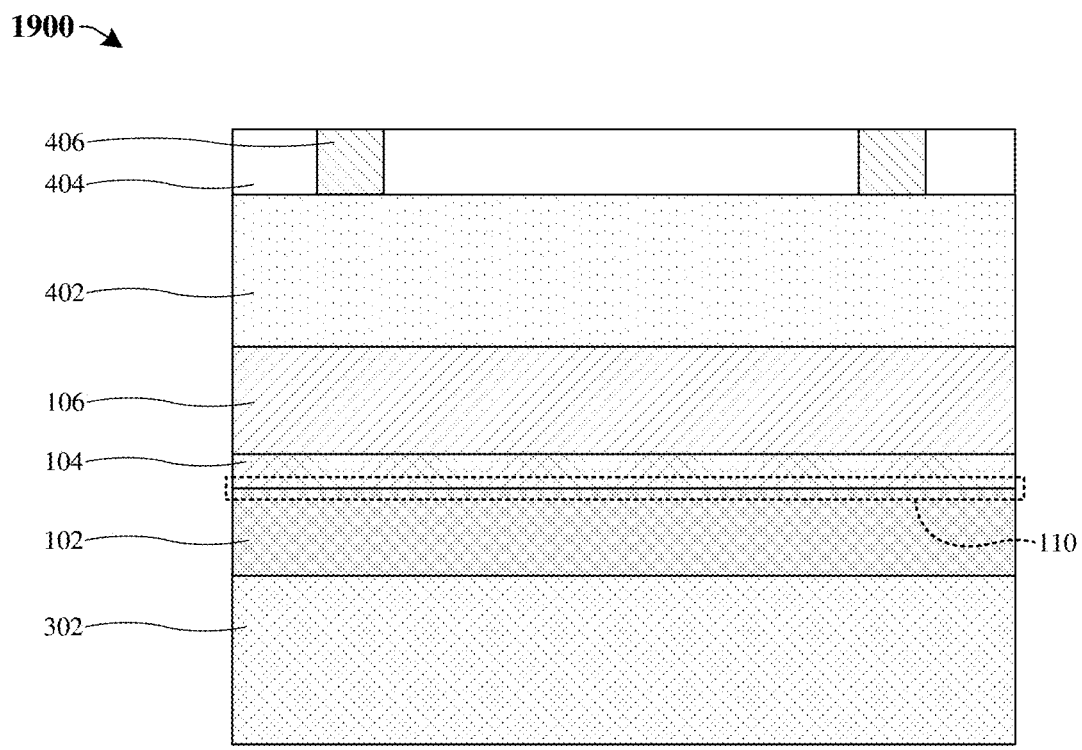

As illustrated by the cross-sectional view 1900 of FIG. 19, a pair of source/drain contacts 406 are formed in the pair of openings 1802. A process for forming the pair of source/drain contacts 406 may be or comprise depositing the pair of source/drain contacts 406 by DC sputtering, PVD, CVD, ALD, some other suitable deposition process, or any combination of the foregoing. In some embodiments, the pair of source/drain contacts 406 may undergo a planarization process (e.g., chemical-mechanical planarization (CMP) or the like), to remove excess material overlying the dielectric structure 404.

Figure 20:
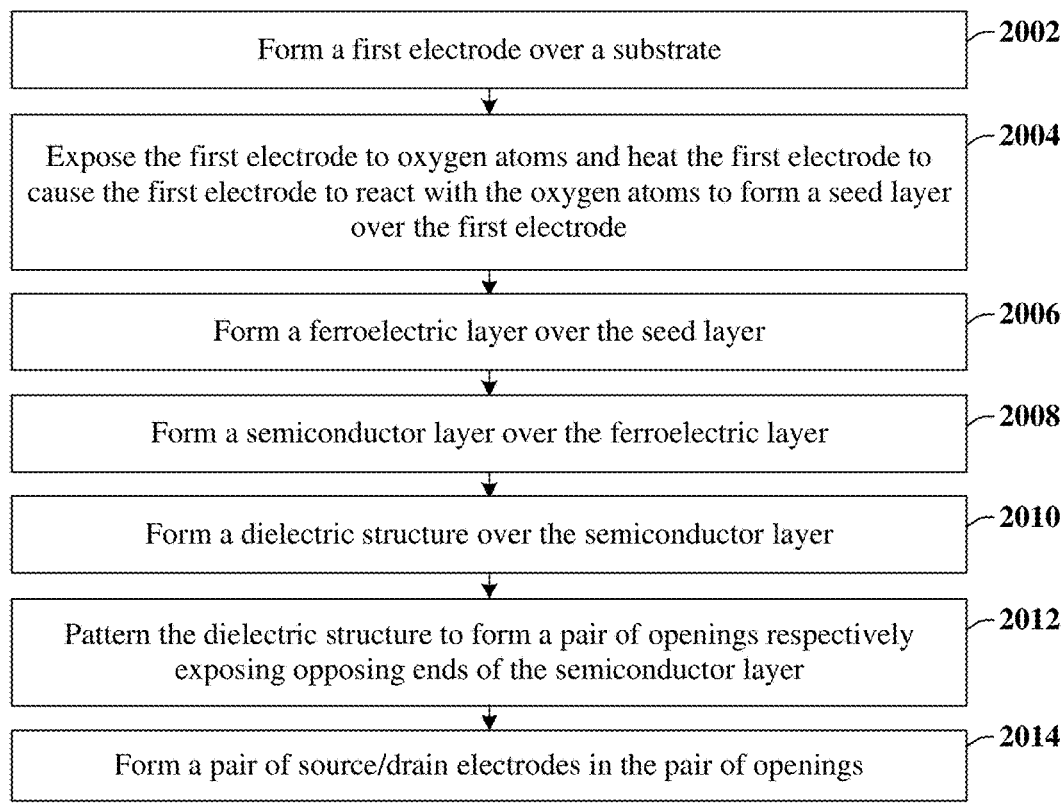
FIG. 20 illustrates a flow diagram of some embodiments of a method corresponding to the cross-sectional views of FIGS. 13-19.

FIG. 20 illustrates a flow diagram 2000 of some embodiments of a method corresponding to the cross-sectional views of FIGS. 13-19.

At act 2002, a first electrode is formed over a substrate. See, for example, FIG. 13.

At act 2004, the first electrode is exposed to oxygen atoms and the first electrode is heated to cause the first electrode to react with the oxygen atoms to form a seed layer over the first electrode. See, for example, FIG. 14.

At act 2006, a ferroelectric layer is formed over the seed layer. See, for example, FIG. 15.

At act 2008, a semiconductor layer is formed over the ferroelectric layer. See, for example, FIG. 16.

At act 2010, a dielectric structure is formed over the semiconductor layer. See, for example, FIG. 17.

At act 2012, the dielectric structure is patterned to form a pair of openings respectively exposing opposing ends of the semiconductor layer. See, for example, FIG. 18.

At act 2014, a pair of source/drain electrodes is formed in the pair of openings. See, for example, FIG. 19.

FIGS. 21-34 illustrate a series of cross-sectional views 2100-3400 of some embodiments of a method for forming an IC in which a top gate FeFET structure comprises a seed layer 104. The IC may, for example, be as described with regard to FIG. 5. Although FIGS. 21-34 are described in relation to a method, it will be appreciated that the structures disclosed in FIGS. 21-34 are not limited to such a method, but instead may stand alone as structures independent of the method.

Figure 21:
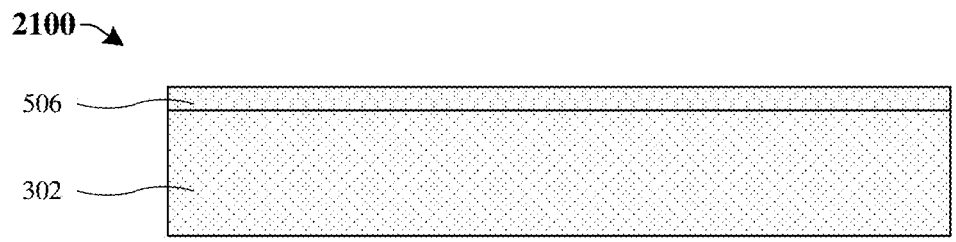
FIGS. 21-34 illustrate a series of cross-sectional views of some embodiments of a method for forming an IC in which a top gate FeFET structure comprises a seed layer.

As illustrated by the cross-sectional view 2100 of FIG. 21, a buffer layer 506 is formed over a substrate 302. In some embodiments, the buffer layer 506 is configured to separate a subsequently formed semiconductor layer from the substrate 302 to accommodate a difference in their crystallographic structures. A process for forming the buffer layer 506 may, for example, be or comprise depositing the buffer layer 506. The depositing may, for example, be performed by CVD, PVD, ALD, some other suitable deposition process, or any combination of the foregoing. In some embodiments, the substrate 302 is as described with regard to FIG. 5.

Figure 22:
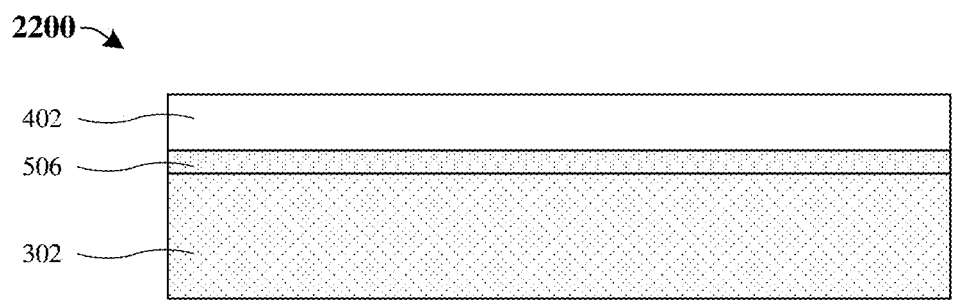

As illustrated by the cross-sectional view 2200 of FIG. 22, a semiconductor layer 402 is formed over the buffer layer 506. A process for forming the semiconductor layer 402 may, for example, be or comprise depositing the semiconductor layer 402 by CVD, PVD, ALD, or some suitable process. In some embodiments, the semiconductor layer 402 is as described with regard to FIG. 5. In embodiments in which the semiconductor layer 402 is silicon-based, the semiconductor layer 402, the buffer layer 506, and the substrate 302 define an SOI substrate. In at least some of such embodiments, the SOI substrate may be provided in lieu of the formation steps of FIGS. 21-22.

Figure 23:
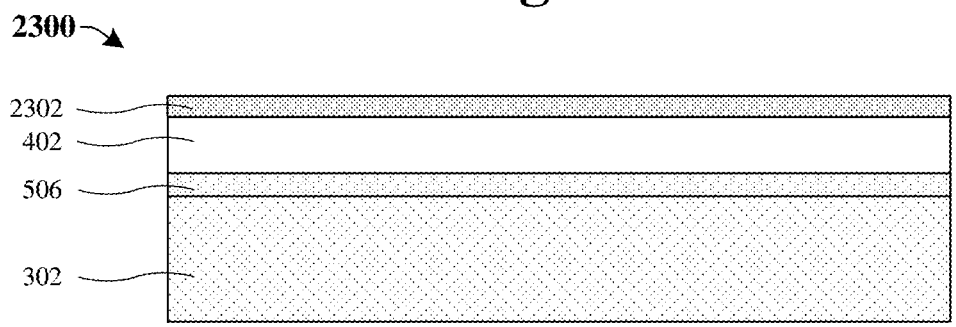

As illustrated by the cross-sectional view 2300 of FIG. 23, an insulating structure 2302 is formed over the semiconductor layer 402. The insulating structure 2302 inhibits oxygen vacancies and/or leakage current at the semiconductor layer 402 to enhance performance. A process for forming the insulating structure 2302 may, for example, be or comprise depositing the insulating structure 2302. The depositing may, for example, be performed by CVD, PVD, ALD, some other suitable deposition process, or any combination of the foregoing. In some embodiments, the insulating structure 2302 is as described with regard to the insulating layer 502 of FIG. 5.

Figure 24:
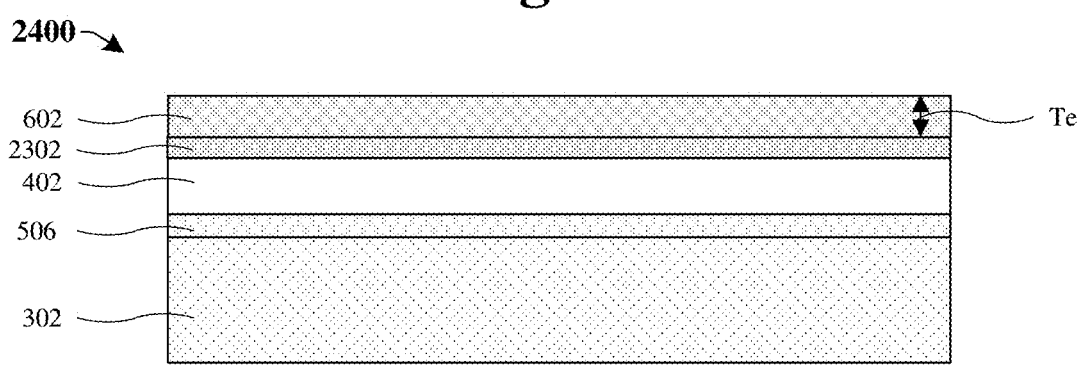

As illustrated by the cross-sectional view 2400 of FIG. 24, a first electrode layer 602 is formed over the insulating structure 2302. A process for forming the first electrode layer 602 may, for example, be or comprise depositing the first electrode layer 602. The depositing may, for example, be performed by DC sputtering, CVD, PVD, ALD, some other suitable deposition process, or any combination of the foregoing. In some embodiments, the first electrode layer 602 is as described with regard to the first electrode 102 of FIG. 5.

Figure 25:
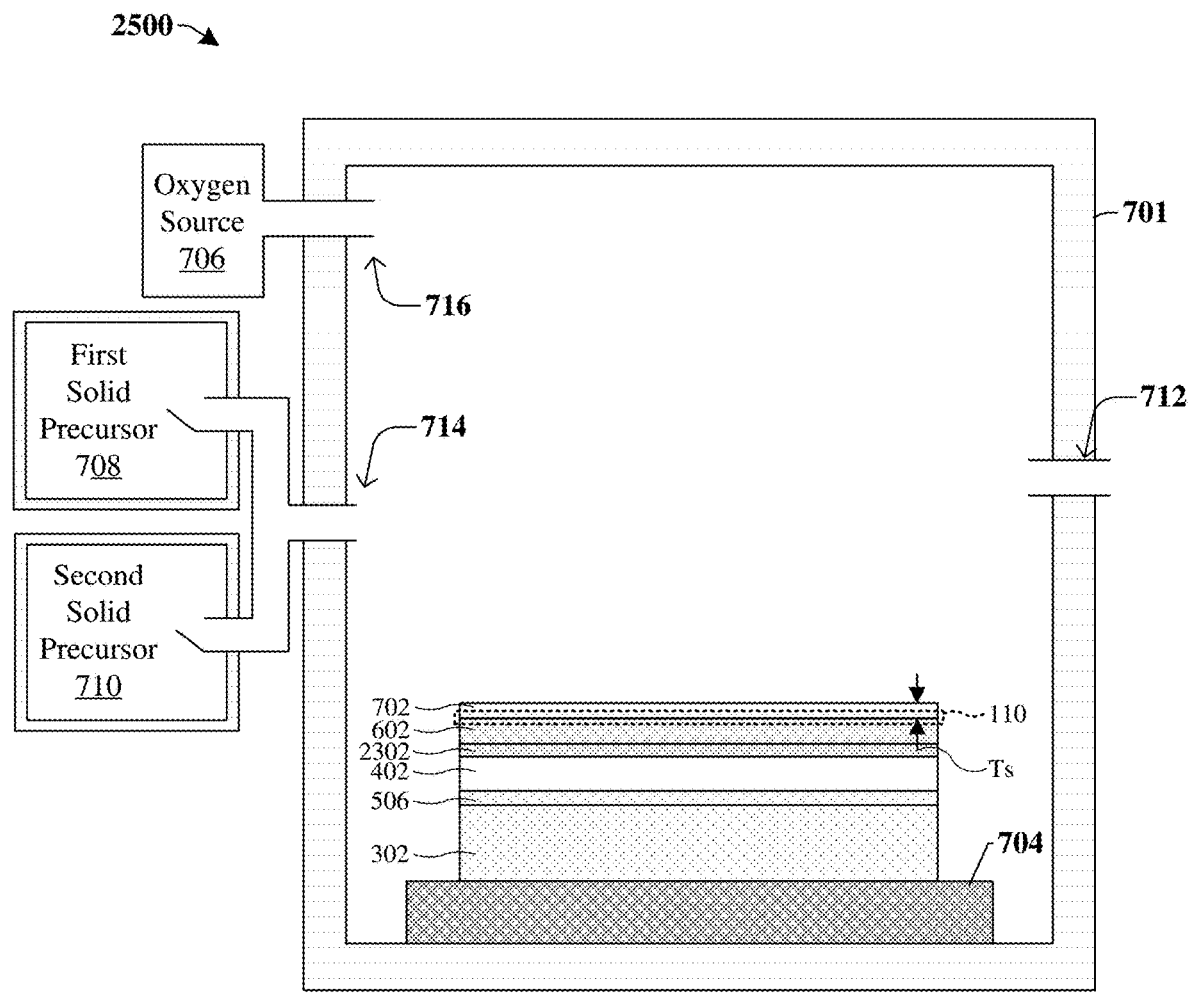

As illustrated by the cross-sectional view 2500 of FIG. 25, a seed structure 702 is formed over the first electrode layer 602. In some embodiments, a process for forming the seed structure 702 is as described with regard to the acts described in FIG. 7. As such, in some embodiments, the substrate 302 may be placed in a process chamber, such that the seed structure 702 may be formed in the process chamber.

The seed structure 702 promotes growth of orthorhombic phase crystals in a subsequently formed ferroelectric structure and/or inhibits growth of monoclinic phase crystals in the ferroelectric structure, which increases the remanent polarization of the ferroelectric structure. Thus, the performance of the memory structure may be improved without undergoing the slow and costly process of providing a precursor to form the seed structure 702, avoiding the presence of remaining precursor in unwanted areas of the memory structure.

In some embodiments, the substrate 302 was already in the process chamber during the formation of the first electrode layer 602 forming in FIG. 24, such that the seed structure 702 is formed in-situ. The in-situ thermal process results in the seed structure 702 having a higher uniformity of crystalline phase (e.g., a higher uniformity of tetragonal crystalline phase, a higher uniformity of orthorhombic crystalline phase, etc.) than other deposition processes that use a precursor. For example, forming a seed structure by way of an ALD process may result in a higher percentage of the seed structure being amorphous than the thermal process. In some embodiments, the in-situ thermal process may cause the seed structure 702 to have a predominant crystalline phase. The higher uniformity of crystalline phase promotes a higher percentage of orthorhombic crystalline phase within the subsequently formed ferroelectric structure, which results in a larger memory read window and hence more resilient memory read operations.

This process further results in the seed structure 702 having a non-uniform oxygen concentration, such that oxygen is more concentrated near the first electrode layer 602. Hence, oxygen ions may enter an inter-diffusion region 110 between the seed structure 702 and the first electrode layer 602 and recombine with defects (e.g., oxygen vacancies), preventing charges from being formed at the interface of the seed structure 702 and the first electrode layer 602, positively impacting device performance.

In some embodiments, the seed structure 702 is formed to have a thickness Ts ranging from approximately 0.5 nanometers to approximately 5 nanometers, approximately 0.5 nanometers to approximately 2 nanometers, approximately 2 nanometers to approximately 5 nanometers, or some other suitable value. In some embodiments, if the thickness Ts is too large (e.g., greater than approximately 5 nanometers), increased resistance of the seed structure 702 may degrade power efficiency and shift operating parameters out of specification. If the thickness Ts is too small (e.g., less than approximately 0.5 nanometers), the seed structure 702 may fail to sufficiently promote orthorhombic phase crystal growth in a subsequently formed ferroelectric structure. In some embodiments, the seed structure 702 is as described with regard to FIG. 5.

Figure 26:
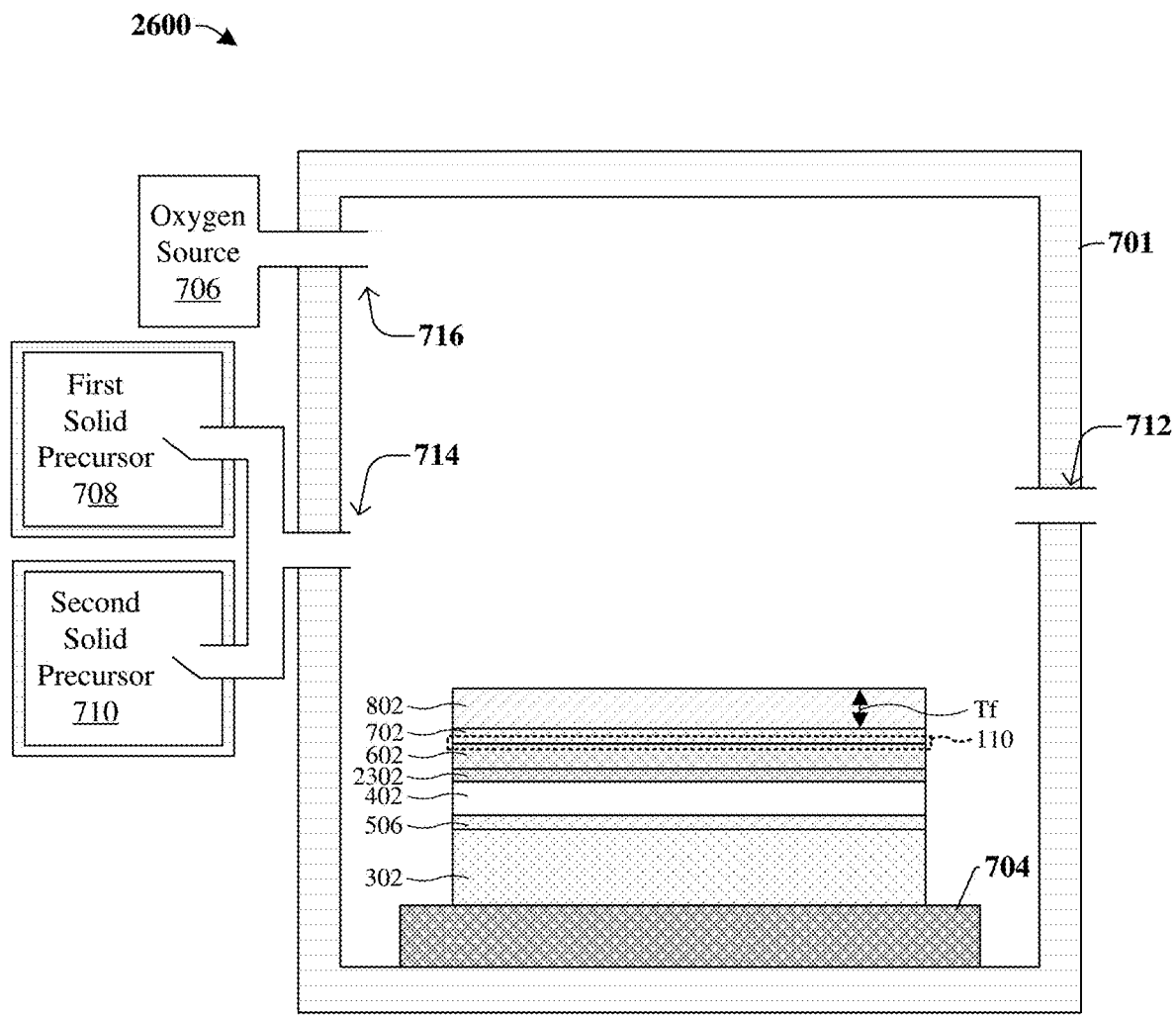

As illustrated by the cross-sectional view 2600 of FIG. 26, a ferroelectric structure 802 is formed over the seed structure 702. In some embodiments, a process for forming the ferroelectric structure 802 is as described with regard to the acts described in FIG. 8. In some embodiments, the ferroelectric structure 802 has a thickness Tf ranging from approximately 1 nanometer to approximately 100 nanometers, approximately 1 nanometer to approximately 20 nanometers, approximately 20 nanometers to approximately 30 nanometers, approximately 50 nanometers to approximately 100 nanometers, or some other suitable value.

By forming the seed structure 702 using an in-situ thermal process, the seed structure 702 has a higher uniformity of crystalline phase than other deposition processes that use a precursor. The higher uniformity of crystalline phase in the seed structure 702 promotes a uniform higher percentage of orthorhombic crystalline phase within the ferroelectric structure 802. Because the orthorhombic phase exhibits a stronger remanent polarization than other crystalline phases, the in-situ ALD process improves a performance of the ferroelectric structure 802 due to a larger difference (e.g., 2Pr) in remanent polarization between the first state and the second state, which results in a larger memory read window and hence more resilient memory read operations. In some embodiments, since the seed structure 702 has a higher uniformity of crystalline phase than other deposition processes that use a precursor, the ferroelectric structure 802 has a substantially uniform orthorhombic crystalline phase. In some embodiments, the ferroelectric structure 802 is formed to have a predominately orthorhombic crystalline phase.

Figure 27:
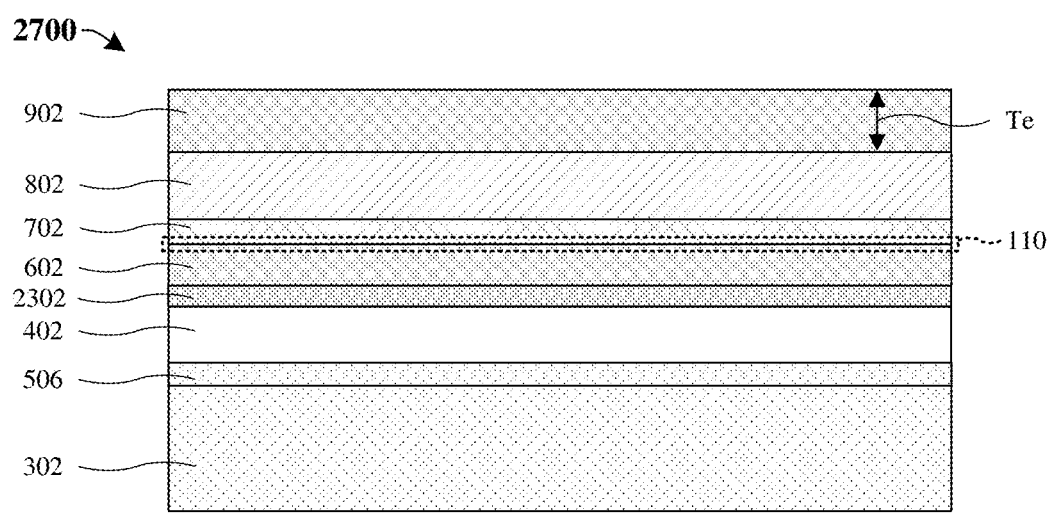

As illustrated by the cross-sectional view 2700 of FIG. 27, a second electrode layer 902 is formed over the ferroelectric structure 802. A process for forming the second electrode layer 902 may be or comprise depositing the second electrode layer 902 by DC sputtering, PVD, CVD, ALD, some other suitable deposition process, or any combination of the foregoing. In some embodiments, the second electrode layer 902 has the thickness Te. In some embodiments, the second electrode layer 902 is as described with respect to the second electrode 108 of FIG. 1. While the second electrode layer 902 is shown as being formed outside of a process chamber, it should be appreciated that in some embodiments, the second electrode layer 902 is formed in the process chamber as described in FIGS. 7A-7C and 8.

Figure 28:
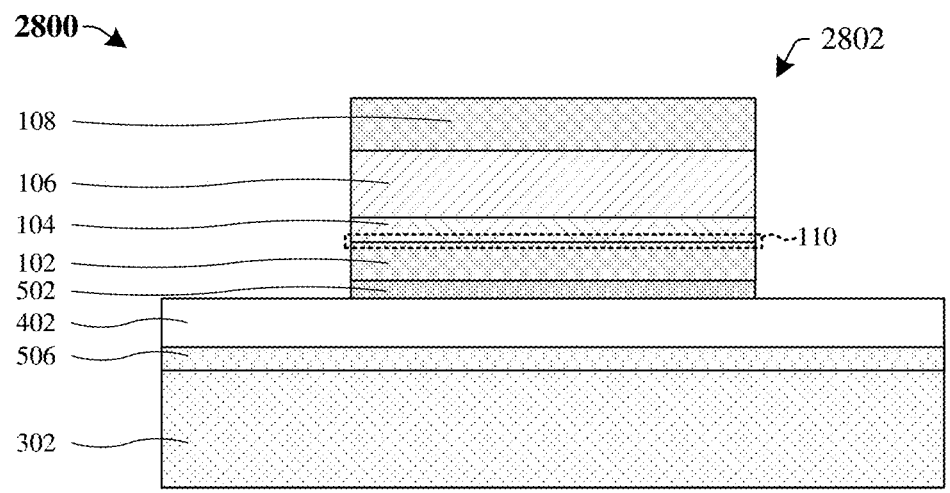

As illustrated by the cross-sectional view 2800 of FIG. 28, the insulating structure 2302, the first electrode layer 602, the seed structure 702, the ferroelectric structure 802, and the second electrode layer 902 are patterned to define a columnar gate stack 2802 respectively comprising an insulating layer 502, a first electrode 102, a seed layer 104, a ferroelectric layer 106, and a second electrode 108. The patterning may, for example, comprise: forming a mask over the second electrode layer 902, etching according to a pattern of the mask, and removing the mask. The etching may, for example, be performed by a dry etch, a wet etch, or some other suitable patterning process.

Figure 29:
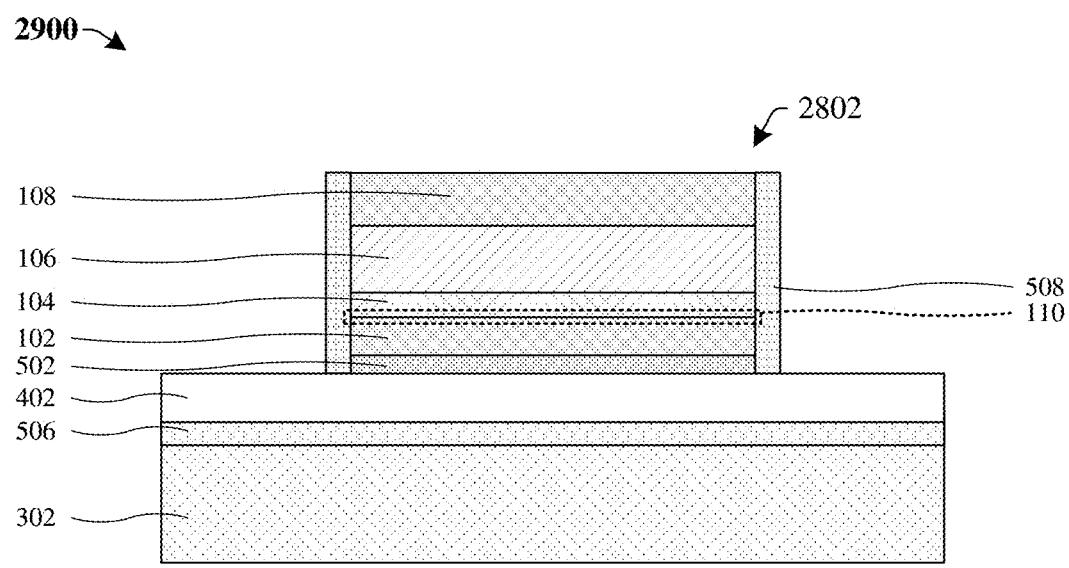

As illustrated by the cross-sectional view 2900 of FIG. 29, a spacer structure 508 is formed on sidewalls of the columnar gate stack 2802. A process for forming the spacer structure 508 may be or comprise: depositing a spacer layer covering the columnar gate stack and on sidewalls of the columnar gate stack 2802 and etching back the spacer layer to localize the spacer layer to the sidewalls. The depositing may, for example, be performed by PVD, CVD, ALD, some other suitable deposition process, or any combination of the foregoing. The spacer layer may, for example, be or comprise silicon nitride, silicon oxide, some other suitable dielectric, or any combination of the foregoing. In some embodiments, the spacer structure 508 is as described with regard to FIG. 5.

Figure 30:
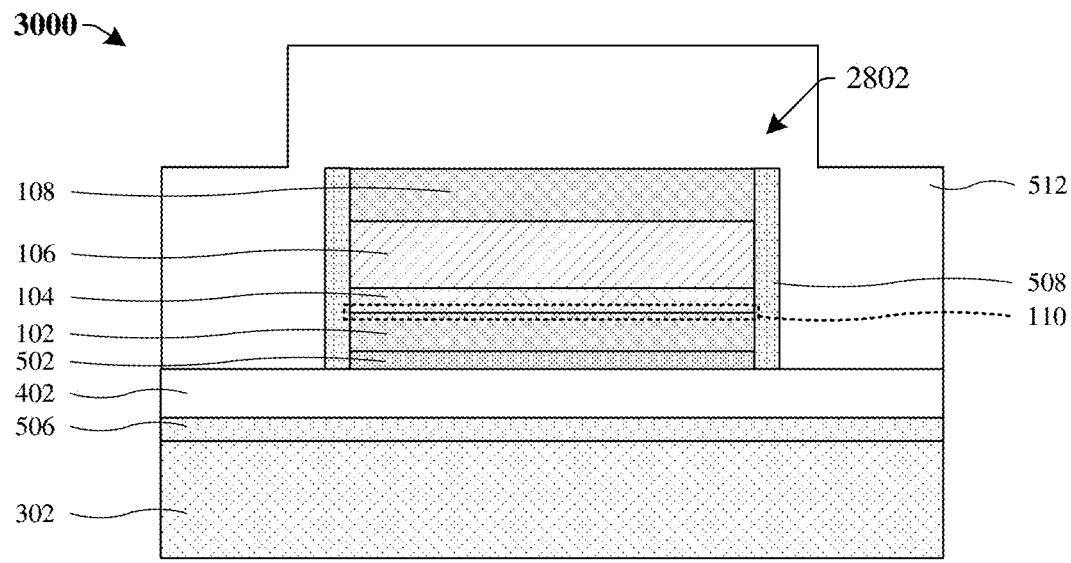

As illustrated by the cross-sectional view 3000 of FIG. 30, a first ILD structure 512 is conformally formed over and surrounding the columnar gate stack 2802. A process for forming the first ILD structure 512 may be or comprise depositing the first ILD structure 512 by PVD, CVD, ALD, some other suitable deposition process, or any combination of the foregoing. In some embodiments, the first ILD structure 512 is as described with regard to FIG. 5.

Figure 31:
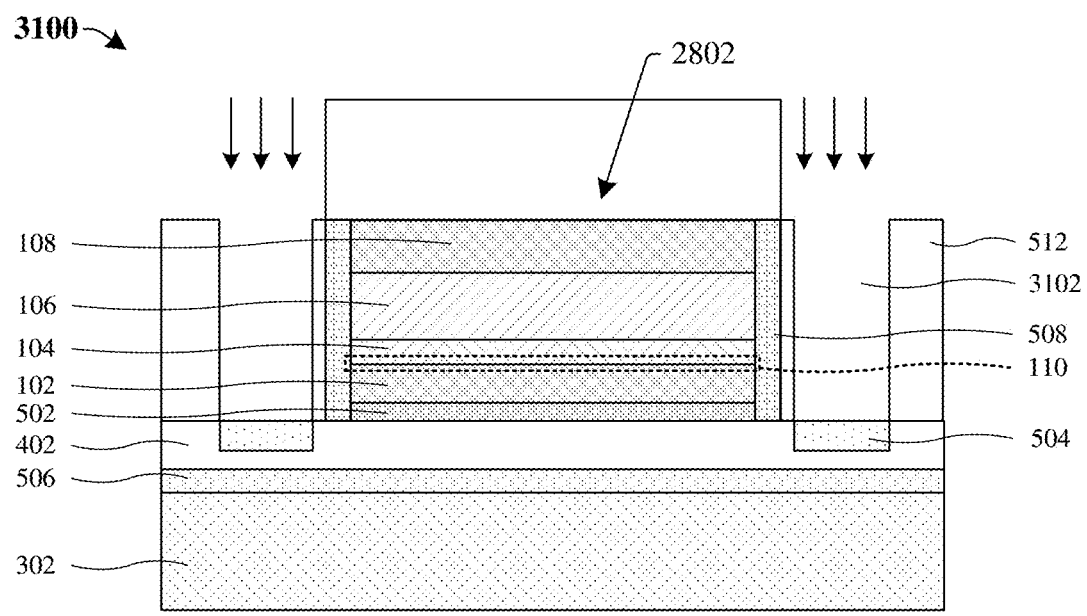

As illustrated by the cross-sectional view 3100 of FIG. 31, the first ILD structure 512 is patterned to form a pair of openings 3102 on opposing sides of the columnar gate stack 2802. In some embodiments, the pair of openings 3102 extend from a top surface of the first ILD structure 512 to a bottom surface of the first ILD structure 512, leaving portions of the semiconductor layer 402 exposed. The patterning may, for example, comprise a photolithography/etching process or some other suitable patterning process. The etch of the photolithography/etching process may, for example, be performed by a dry etch, a wet etch, some other suitable etch, or a combination of the foregoing. In some embodiments in which the semiconductor layer 402 is silicon-based, the exposed portions of the semiconductor layer 402 are doped by, for example, ion implantation of n-type dopants or p-type dopants, or some other suitable doping process, thereby forming doped regions 504 of the semiconductor layer 402. The doped regions 504 may, for example, be n-type or p-type.

Figure 32:
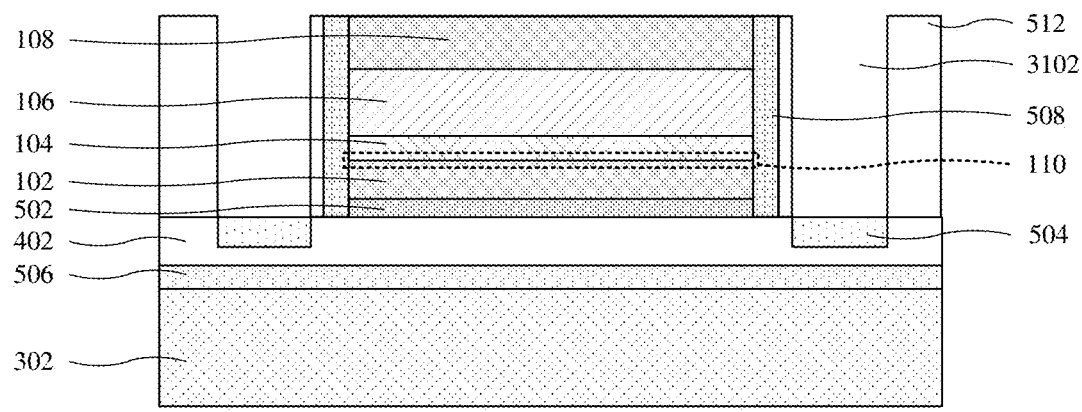

As illustrated by the cross-sectional view 3200 of FIG. 32, the first ILD structure 512 is thinned down. In some embodiments, a top surface of the first ILD structure 512 is aligned with a top surface of the second electrode 108. The thinning down process may comprise, for example, etching (e.g., a dry etch, a wet etch, etc.), a planarization process (e.g., CMP), or the like.

Figure 33:
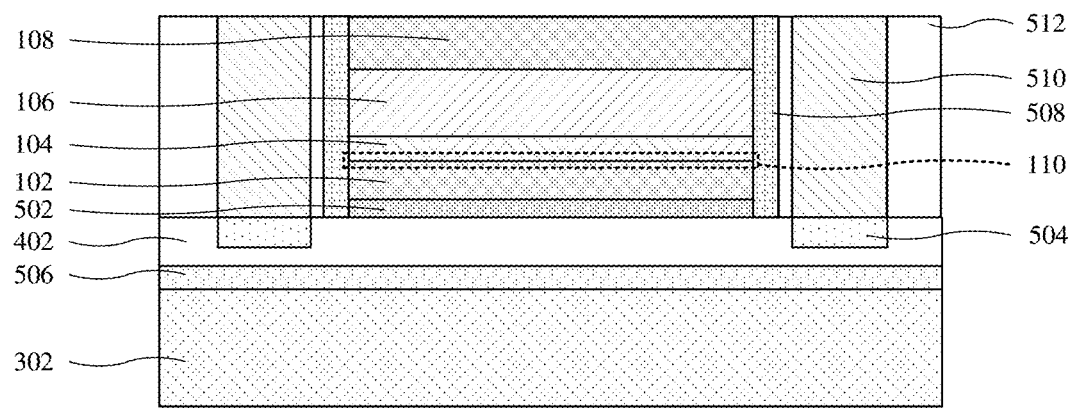

As illustrated by the cross-sectional view 3300 of FIG. 33, a pair of source/drain contacts 510 is formed in the pair of openings 3102 on opposing sides of the columnar gate stack 2802. A process for forming the pair of source/drain contacts 510 may, for example, be or comprise depositing the pair of source/drain contacts 510 into the pair of openings 3102 and subsequently performing a planarization to localize the source/drain contacts 510 to the openings 3102. The depositing may, for example, be performed by CVD, PVD, ALD, some other suitable deposition process, or any combination of the foregoing. The planarization may, for example, be performed by a CMP or some other suitable planarization process.

Figure 34:
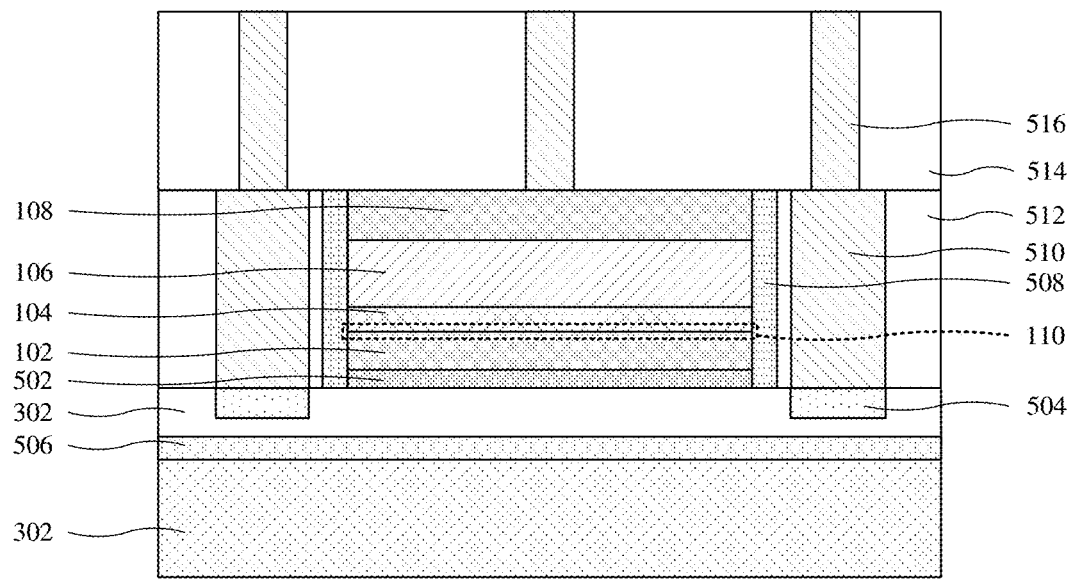

As illustrated by the cross-sectional view 3400 of FIG. 34, a second ILD structure 514 is formed over the pair of source/drain contacts 510 and the second electrode 108, and a plurality of contacts 516 is formed, extending through the second ILD structure 514 to contact the pair of source/drain contacts 510 and the second electrode 108. The second ILD structure 514 and the plurality of contacts 516 may be formed by, for example, a damascene process, or some other suitable process.

Figure 35:
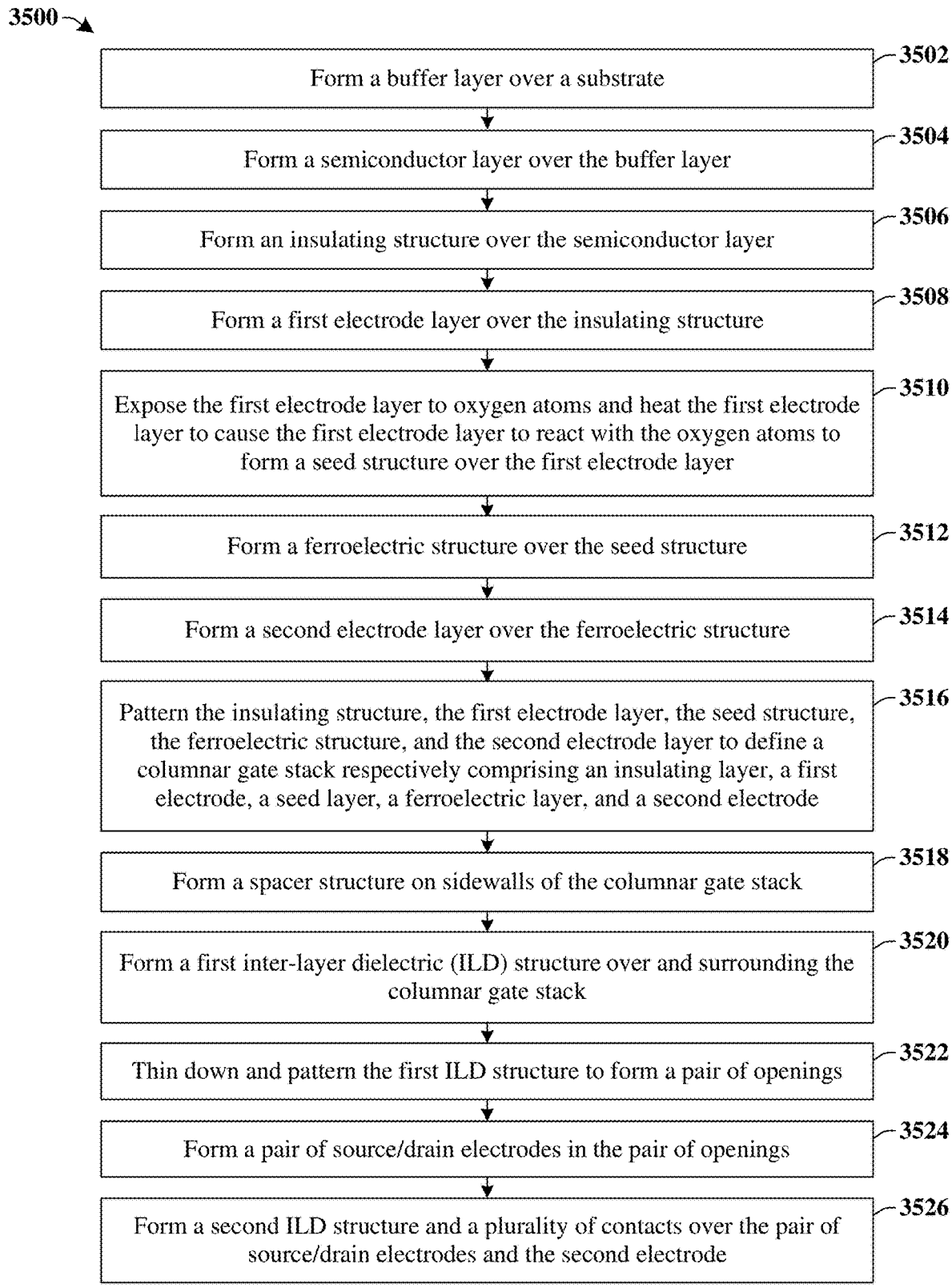
FIG. 35 illustrates a flow diagram of some embodiments of a method corresponding to the cross-sectional views of FIGS. 22-35.

FIG. 35 illustrates a flow diagram 3500 of some embodiments of a method corresponding to the cross-sectional views of FIGS. 22-35.

At act 3502, a buffer layer is formed over a substrate. See, for example, FIG. 21.

At act 3504, a semiconductor layer is formed over the buffer layer. See, for example, FIG. 22.

At act 3506, an insulating structure is formed over the semiconductor layer. See, for example, FIG. 23.

At act 3508, a first electrode layer is formed over the insulating structure. See, for example, FIG. 24.

At act 3510, the first electrode layer is exposed to oxygen atoms and the first electrode layer is heated to cause the first electrode layer to react with the oxygen atoms to form a seed structure over the first electrode layer. See, for example, FIG. 25.

At act 3512, a ferroelectric structure is formed over the seed structure. See, for example, FIG. 26.

At act 3514, a second electrode layer is formed over the ferroelectric structure. See, for example, FIG. 27.

At act 3516, the insulating structure, the first electrode layer, the seed structure, the ferroelectric structure, and the second electrode layer are patterned to define a columnar gate stack respectively comprising an insulating layer, a first electrode, a seed layer, a ferroelectric layer, and a second electrode. See, for example, FIG. 28.

At act 3518, a spacer structure is formed on sidewalls of the columnar gate stack. See, for example, FIG. 29.

At act 3520, a first inter-layer dielectric (ILD) structure is formed over and surrounding the columnar gate stack. See, for example, FIG. 30.

At act 3522, the first ILD structure is thinned down and patterned to form a pair of openings. See, for example, FIGS. 31-32.

At act 3524, a pair of source/drain electrodes is formed in the pair of openings. See, for example, FIG. 33.

At act 3526, a second ILD structure and a plurality of contacts are formed over the pair of source/drain electrodes and the second electrode. See, for example, FIG. 34.

Accordingly, in some embodiments, the present disclosure relates to a method for forming a memory device, that includes forming a seed layer over a bottom electrode using a thermal process that is in-situ with formation of an overlying ferroelectric layer. The thermal process results in the seed layer having a higher uniformity of crystalline phase than other deposition processes using a precursor. The higher uniformity of crystalline phase, promote a higher percentage of orthorhombic crystalline phase within the ferroelectric layer and thus an improved performance of the memory device.

In some embodiments, the present disclosure relates to a method for forming an integrated circuit (IC), including forming a first electrode layer having a first metal over a substrate, performing a first atomic layer deposition (ALD) pulse that exposes the first electrode layer to oxygen atoms, exposing the first electrode layer to a first temperature, the first temperature causing the first electrode layer to react with the oxygen atoms to form a seed structure over the first electrode layer, and performing a series of ALD pulses at a second temperature to form a ferroelectric structure over the seed structure. The second temperature is less than the first temperature and the ferroelectric structure is configured to store a data state.

In other embodiments, the present disclosure relates to method for forming an integrated circuit (IC), including forming an electrode over a substrate, forming a seed layer over the electrode. Forming the seed layer includes activating an oxygen source within a process chamber and performing a heating process on the electrode within the process chamber, wherein the heating process causes the electrode to react with the oxygen source to form the seed layer, forming a ferroelectric layer over the seed layer within the process chamber, forming a semiconductor layer over the ferroelectric layer, and forming a pair of source/drain contacts laterally separated and respectively on opposite sides of the semiconductor layer.

In yet other embodiments, the present disclosure relates to an integrated circuit (IC), including a substrate, an electrode disposed over the substrate, a ferroelectric layer vertically stacked with the electrode, a seed layer comprising oxygen vertically stacked between the electrode and the ferroelectric layer, an oxygen distribution of the seed layer being non-uniform such that oxygen is more concentrated near the electrode, and an inter-diffusion region between the seed layer and the electrode configured to prevent the formation of charges at an interface of the seed layer and the electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC), comprising:

forming a first electrode layer comprising a first metal over a substrate;
performing a first atomic layer deposition (ALD) pulse that exposes the first electrode layer to oxygen atoms;
exposing the first electrode layer to a first temperature, wherein the first temperature causes the first electrode layer to react with the oxygen atoms to form a seed structure over the first electrode layer; and
performing a series of ALD pulses at a second temperature to form a ferroelectric structure over the seed structure, wherein the second temperature is less than the first temperature and wherein the ferroelectric structure is configured to store a data state.

2. The method of claim 1, wherein the seed structure is formed to have a predominantly crystalline phase.

3. The method of claim 1, further comprising:
forming a semiconductor layer over the substrate;
etching the first electrode layer, the seed structure, and the ferroelectric structure to form a columnar gate stack comprising a first electrode, a seed layer, a ferroelectric layer, and a second electrode; and
forming a pair of source/drain contacts on the semiconductor layer and on opposing sides of the columnar gate stack.

4. The method of claim 1, wherein the seed structure causes the series of ALD pulses to form the ferroelectric structure to have a predominately orthorhombic crystalline phase.

5. The method of claim 1, wherein the first ALD pulse is performed in-situ with exposing the first electrode layer to the first temperature.

6. The method of claim 1, further comprising:
forming a semiconductor layer over the ferroelectric structure; and
forming a pair of source/drain contacts laterally separated and respectively on opposite sides of the semiconductor layer.

7. The method of claim 1, wherein the first ALD pulse is performed at a third temperature that is less than the first temperature, and wherein the first electrode layer is exposed to the first temperature after performing the first ALD pulse.

8. The method of claim 1, wherein the first ALD pulse is performed at the first temperature.

9. The method of claim 1, wherein the first temperature is in a range of between approximately 400 degrees Celsius and approximately 700 degrees Celsius.

10. The method of claim 9, wherein the first electrode layer is exposed to the first temperature for a time period of between approximately 60 seconds and approximately 300 seconds.

11. The method of claim 1, wherein the oxygen atoms are provided by an oxygen source comprising water, ozone, or oxygen gas.

12. A method for forming an integrated circuit (IC), comprising:
forming an electrode over a substrate;
forming a seed layer over the electrode, wherein forming the seed layer comprises:
activating an oxygen source within a process chamber; and
performing a heating process on the electrode within the process chamber, wherein the heating process causes the electrode to react with the oxygen source to form the seed layer;
forming a ferroelectric layer over the seed layer within the process chamber, wherein the ferroelectric layer is formed to have a predominately orthorhombic crystalline phase;
forming a semiconductor layer over the ferroelectric layer; and
forming a pair of source/drain contacts laterally separated and respectively on opposite sides of the semiconductor layer.

13. The method of claim 12, wherein forming the ferroelectric layer comprises performing a plurality of formation cycles, wherein respective formation cycles comprise:
activating a first solid precursor;
exposing the first solid precursor to the oxygen source;
activating a second solid precursor; and
exposing the second solid precursor to the oxygen source.

14. The method of claim 12, wherein the electrode has a thickness that is more than approximately 20 times greater than that of the seed layer.

15. The method of claim 12, wherein the electrode is formed in the process chamber.

16. The method of claim 12, wherein the pair of source/drain contacts are disposed on an opposite side of the semiconductor layer as the electrode.

17. The method of claim 12, wherein the pair of source/drain contacts are disposed on a same side of the semiconductor layer as the electrode.

18. A method of forming an integrated circuit (IC), comprising:
forming a first electrode layer over a substrate;
forming a seed structure onto the first electrode layer, wherein the seed structure is configured to promote growth of orthorhombic phase crystals in a subsequently formed and overlying layer;
forming a ferroelectric structure onto the seed structure, wherein the ferroelectric structure has a predominately orthorhombic crystal phase; and
forming a second electrode layer over the ferroelectric structure.

19. The method of claim 18, wherein the seed structure is further configured to inhibit growth of monoclinic phase crystals in the subsequently formed and overlying layer.

20. The method of claim 18, wherein during formation of the seed structure an inter-diffusion region is formed between the seed structure and the first electrode layer, the inter-diffusion region being configured to prevent a formation of charges at an interface of the seed structure and the first electrode layer.

* * * * *